US009171805B2

(12) United States Patent
Kato et al.

(10) Patent No.: US 9,171,805 B2
(45) Date of Patent: Oct. 27, 2015

(54) SUBSTRATE IDENTIFICATION CIRCUIT AND SEMICONDUCTOR DEVICE

(75) Inventors: Kiyoshi Kato, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 967 days.

(21) Appl. No.: 11/054,953

(22) Filed: Feb. 11, 2005

(65) Prior Publication Data

US 2005/0156819 A1      Jul. 21, 2005

Related U.S. Application Data

(62) Division of application No. 10/330,029, filed on Dec. 27, 2002, now Pat. No. 6,867,430.

(30) Foreign Application Priority Data

Dec. 28, 2001   (JP) .................................. 2001-402039

(51) Int. Cl.
*H01L 29/04* (2006.01)
*H01L 29/76* (2006.01)
(Continued)

(52) U.S. Cl.
CPC .............. *H01L 23/544* (2013.01); *H01L 27/12* (2013.01); *H01L 27/1214* (2013.01);
(Continued)

(58) Field of Classification Search
CPC ................. H01L 2223/54433; H01L 27/1214
USPC .............. 257/59, 288, 347, 392, E27.059, 55, 257/E27.111; 345/55
See application file for complete search history.

(56) References Cited

U.S. PATENT DOCUMENTS 5,222,043 A * 6/1993 Pribyl et al. ........... 365/189.011
6,157,361 A * 12/2000 Kubota et al. ................. 345/100
(Continued)

FOREIGN PATENT DOCUMENTS

EP        1341214 A1      9/2003
JP        11-145237       5/1999
(Continued)

OTHER PUBLICATIONS

S. Maeda et al., "An Artificial Fingerprint Device (AFD) Module using Poly-Si Thin Film Transistors with Logic LSI Compatible Process for Built-in Security", IEDM 01 759-762, 2001.

*Primary Examiner* — Julio J Maldonado
*Assistant Examiner* — Cory Eskridge
(74) *Attorney, Agent, or Firm* — Nixon Peabody LLP; Jeffrey L. Costellia

(57)   ABSTRACT

Provided is a substrate identification circuit that generates a numeric value, whose duplication is difficult and which is proper to a substrate, at low cost and a semiconductor device having such a substrate identification circuit. A substrate identification circuit 304 is produced by utilizing variations in characteristics among TFTs formed on a substrate having an insulating surface. The substrate identification circuit 304 includes a plurality of proper bit generating circuits, each of which is constructed from a plurality of TFTs and outputs a one-bit random number based on variations in characteristics among the plurality of TFTs. The substrate identification circuit generates a numeric value proper to the substrate using the one-bit random number. The substrate identification circuit may include a circuit that makes a judgment by comparing the numeric value proper to the substrate with an identification number inputted from the outside.

19 Claims, 19 Drawing Sheets

(51) Int. Cl.
*H01L 23/544* (2006.01)
*H01L 27/12* (2006.01)

(52) U.S. Cl.
CPC ............ *H01L 2223/5444* (2013.01); *H01L 2223/54433* (2013.01); *H01L 2924/0002* (2013.01); *H01L 2924/12044* (2013.01)

(56) References Cited

U.S. PATENT DOCUMENTS

| | | | |
|---|---|---|---|
| 6,161,213 A * | 12/2000 | Lofstrom | 324/750.15 |
| 6,424,331 B1 | 7/2002 | Ozawa | |
| 6,437,367 B1 | 8/2002 | Yamazaki et al. | |
| 6,597,014 B1 * | 7/2003 | Yamazaki et al. | 257/59 |
| 6,867,430 B2 * | 3/2005 | Kato et al. | 257/59 |
| 6,941,536 B2 | 9/2005 | Muranaka | |
| 7,282,377 B2 | 10/2007 | Muranaka | |
| 2003/0075745 A1 | 4/2003 | Maeda et al. | |
| 2003/0075746 A1 | 4/2003 | Maeda et al. | |
| 2006/0050580 A1 * | 3/2006 | Yamaguchi et al. | 365/201 |
| 2006/0212709 A1 * | 9/2006 | Kinoshita et al. | 713/176 |
| 2008/0028349 A1 | 1/2008 | Muranaka | |

FOREIGN PATENT DOCUMENTS

| | | | | |
|---|---|---|---|---|
| JP | 2000-19557 | * | 1/2000 | G02F 1/136 |
| WO | WO 02/50910 A1 | | 6/2002 | |

* cited by examiner

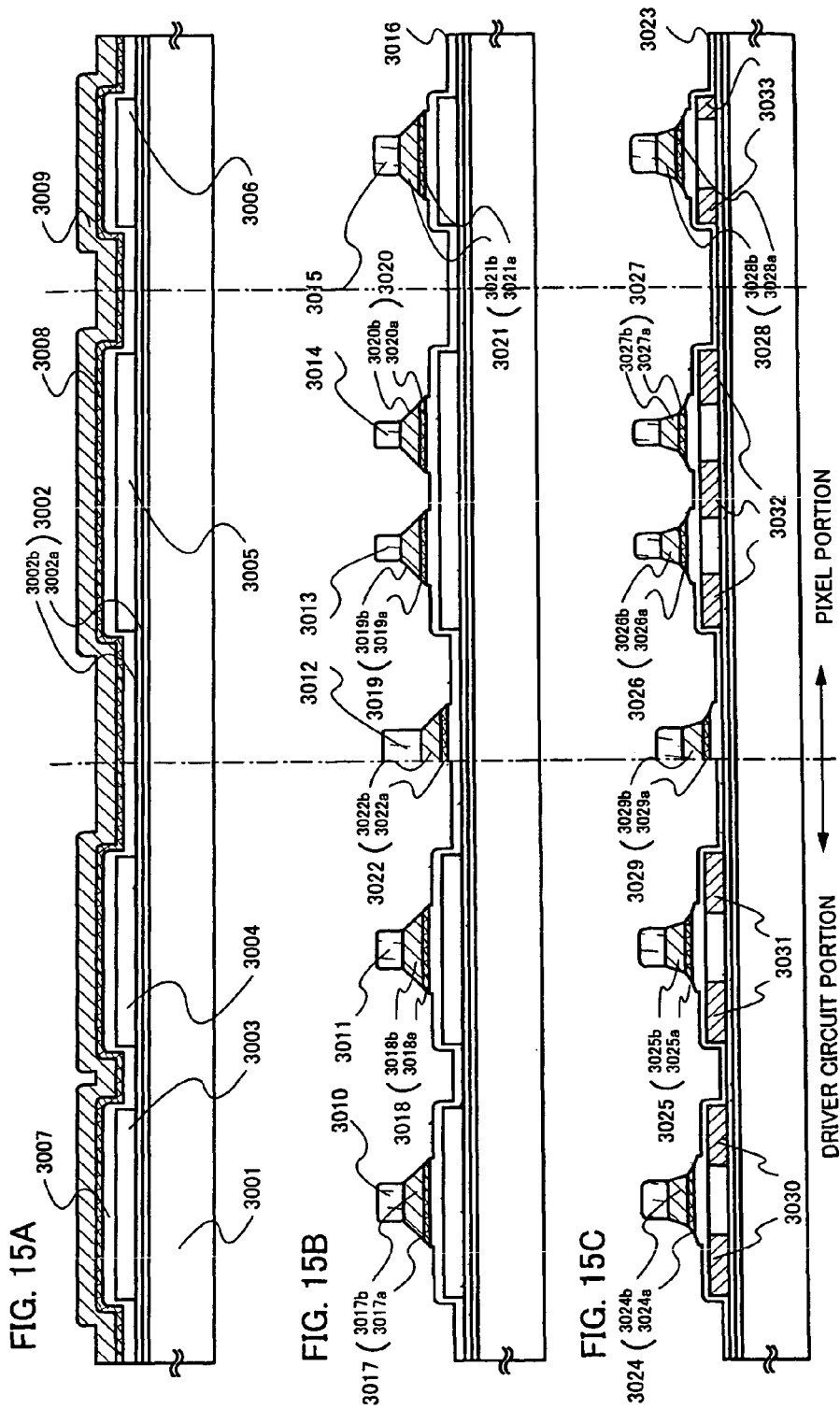

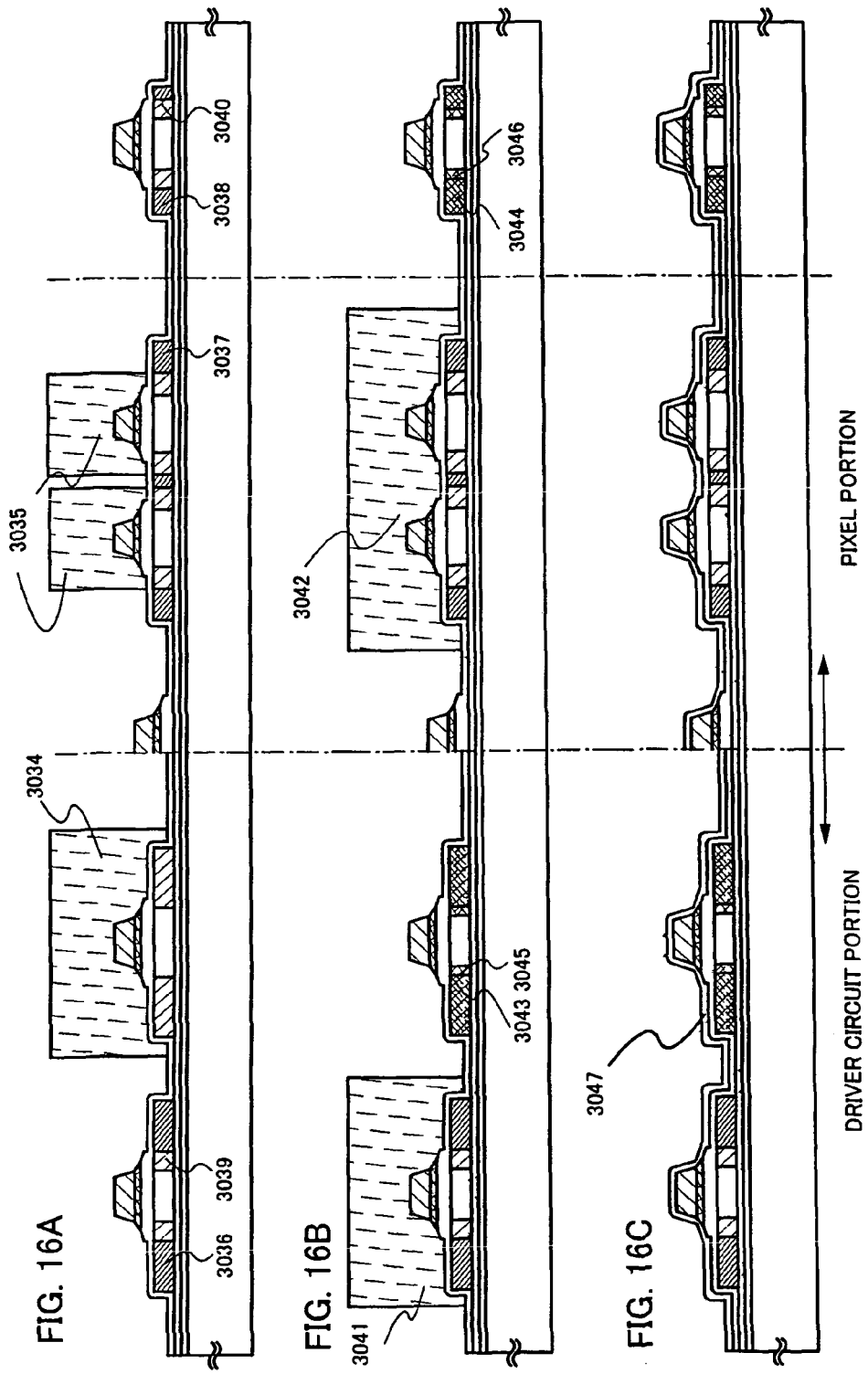

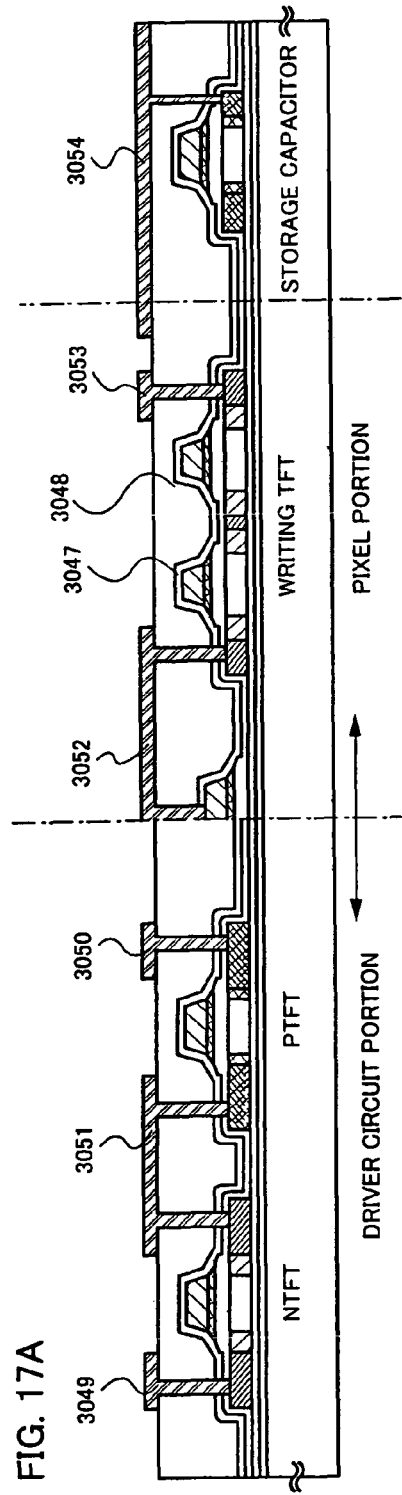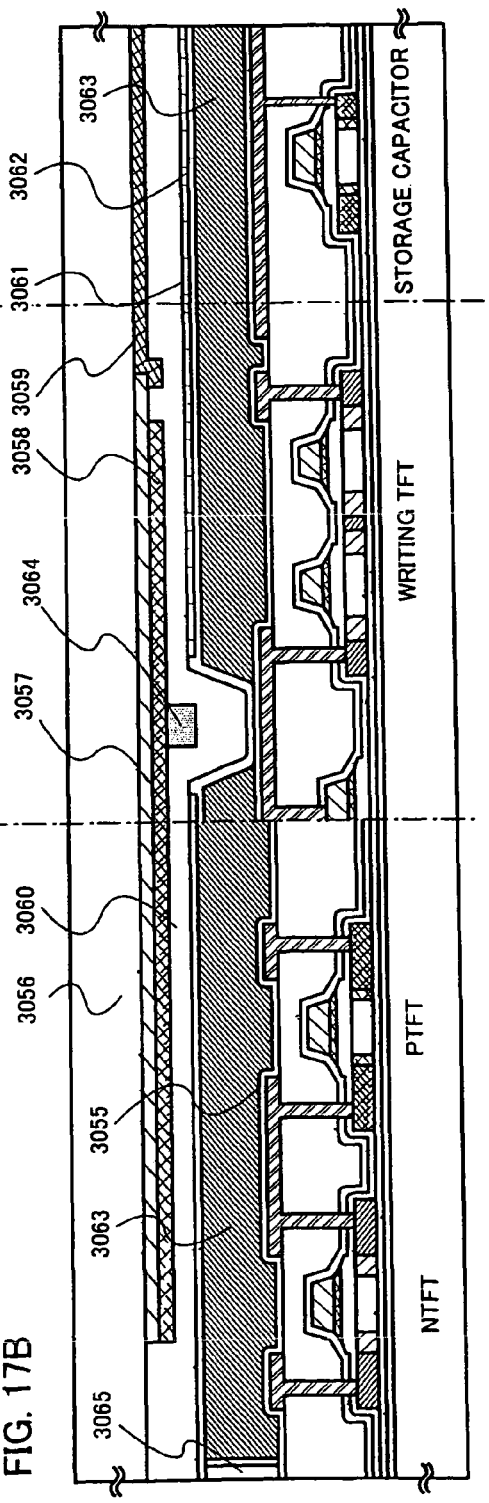

SUBSTRATE IDENTIFICATION CIRCUIT AND SEMICONDUCTOR DEVICE

BACKGROUND OF THE INVENTION

1. Field of the Invention

The present invention relates to a substrate identification circuit constructed from a thin film transistor formed on a substrate having an insulating surface, and a semiconductor device.

2. Description of the Related Art

In recent years, semiconductor devices, particularly electric equipment with semiconductor display portions have made remarkable developments. There are variety of application examples thereof, including game machines, notebook computers, portable equipment represented by mobile telephones, liquid crystal televisions, liquid crystal displays, electro-luminescent (EL) displays and the like. Compared to conventional cathode ray tubes (CRT), it is possible to form thinner lightweight displays for semiconductor display portions featuring low energy consumption.

Semiconductor display portions are classified into two types, a passive matrix type and an active matrix type, but in recent years especially, technologies for forming thin film transistors (TFTs) on a glass substrate have advanced, and applications and developments for active matrix type semiconductor device portions have progressed.

In particular, compared to a TFT with an amorphous silicon film, a TFT with a polycrystalline silicon film has a higher field effect mobility (also called mobility), and while conventionally the pixel is controlled by the driving circuit outside the substrate, it is now possible to control with the driving circuit formed on the same substrate on which the pixel is formed.

Also, if a TFT with a further higher field effect mobility is developed in the future, it is expected that a system-on-glass structure will be realized in which not only the driving circuit of the pixel portion but also various logic circuits such as operation processing and memories which are conventionally mounted outside the substrate as IC chips are formed on a glass substrate having pixel portions formed thereon.

SUMMARY OF THE INVENTION

If semiconductor devices including substrates, on which there have been formed TFTs constituting pixel portions or various logic circuits, come into widespread use as a result of this development, it becomes important to identify the substrates.

It should be noted here that substrates obtained by forming TFTs on substrates having insulating surfaces are called "TFT substrates". Accordingly, the substrates described above, on which there have been formed TFTs constituting pixel portions and various logic circuits, are also TFT substrates.

If it is possible to assign proper numeric values to respective TFT substrates, it becomes possible for factories or manufacturers to manage the TFT substrates using the numeric values proper to the TFT substrates as identification numbers. Also, in the case where guarantees or rights to receive service or the like are selectively given to the TFT substrates, it is possible to use the numeric values proper to the TFT substrates as identification numbers.

In view of this problem, the present invention has been made and the object of the present invention is therefore to provide a circuit that assigns a proper numeric value to a TFT substrate obtained by forming a pixel portion, a driving circuit for the pixel portion, and logic circuits on a substrate having an insulating surface. In particular, the object of the present invention is to provide a circuit that assigns a proper numeric value that is suited for the purpose of managing a TFT substrate and selectively giving a guarantee or a right to receive service or the like to the TFT substrate. The object of the present invention is also to provide a semiconductor device in which there has been implemented a TFT substrate to which a proper numeric value has been assigned by such a circuit.

As described above, it becomes important to form a substrate identification circuit on a substrate having an insulating surface along with a pixel portion and various logic circuits.

In particular, in the case where it is intended to manage a TFT substrate or selectively give a guarantee or a right to receive service or the like to a TFT substrate, it is important that an identification number has the following features.

First, the usage of a component separated from the TFT substrate for the sake of giving an identification number is not preferable because this leads to an increase in cost, time, and effort. In other words, it is preferable that the identification number is formed on the TFT substrate. It is in particular preferable that the identification number is given concurrently with the formation of a pixel portion and various logic circuits.

Also, in the case where the identification number is formed on the TFT substrate with the formation of a pixel portion and various logic circuits at the same time, it is preferable that the same mask can be used irrespective of which number is to be given as the identification number. For instance, even in the case where the identification number is written using numeric characters or is electrically generated using a mask ROM, it is not preferable, from the viewpoint of cost, that the mask is changed depending on which number is to be given as the identification number.

Also, it is preferable that the identification number can be handled as an electric signal. That is, it is preferable that the identification number is generated or judged by an electric circuit formed on a glass substrate. If there is used a scheme with which it is possible to electrically process the identification number of a TFT substrate, it becomes possible to use the identification number of the TFT substrate as a password for permitting the operation of a pixel portion, a driving circuit for the pixel portion, or a logic circuit formed on the TFT substrate, for instance. Also, it is possible to apply the identification number to the selective giving of service through information communication over the Internet or the like.

A more important thing is how to ensure a high level of safety in the case where the identification number of a substrate is used as a password. If it is possible to rewrite the substrate identification number on the TFT substrate without difficulty, for instance, it becomes difficult to selectively give a right to the TFT substrate. Accordingly, it is not preferable that the substrate identification number is constructed of a rewritable nonvolatile memory such as an EEPROM. As can be seen from this, it is important that it is difficult to duplicate or rewrite a substrate identification number as well as that the substrate identification number is proper to a TFT substrate.

The object of the present invention is to provide a scheme with which it is possible to give a substrate identification number having the features described above, that is, a substrate identification number that can be electrically handled and realizes a high level of safety at low cost.

In the present invention, first, an identification number is given or judged using a circuit constructed from TFTs. As a result, it becomes possible to give the identification number concurrently with the formation of a pixel portion and various logic circuits and to electrically handle the identification number. Note that in the present invention, such a circuit that gives or judge the substrate identification number is referred to as the "substrate identification circuit". It is also possible to say that this substrate identification circuit is a circuit that generates a number proper to a substrate or a circuit that generates a number proper to a substrate and makes identification of the substrate.

The present invention is characterized in that by paying attention to variations in characteristics among TFTs formed on a substrate having an insulating surface, a substrate identification circuit is produced by utilizing the characteristic variations among the TFTs. In the present invention, "0/1" is generated using the characteristic variations among the TFTs, so that it becomes unnecessary to change a mask for each substrate, unlike in the case of a mask ROM. Also, it becomes possible to produce a substrate identification circuit at low cost. At the same time, it becomes possible to realize a substrate identification circuit that achieves a high level of safety by making it difficult to rewrite or duplicate a substrate identification number.

The fundamental concept of the substrate identification circuit that utilizes variations in TFT characteristics will be described with reference to FIG. 2A. A circuit 201 shown in FIG. 2A is a circuit constructed from k (k is an integer at least equal to one) TFTs 202(1) to 202(k), with one of the source and drain of each of the k TFTs 202(1) to 202(k) being connected to a power supply VDD and a potential VG being applied to the gate electrode thereof. The other of the source and drain of each of the k TFTs 202(1) to 202(k) outputs one of V(1) to V(k).

In the circuit 201, it is assumed that the k TFTs 202(1) to 202(k) are TFTs having the same size and the threshold values Vth(1) to Vth(k) of the k TFTs vary in a range of δV whose center is V0.

It should be noted here that the variations in the threshold values are expressed by a standard deviation in the case where the distribution of the threshold values is approximated by a normal distribution.

For instance, it is assumed that the k TFTs 202(1) to 202(k) are of N-channel type and the power supply VDD and the voltage VG are in a relation of "VDD>VG−Vth(i)" with reference to each threshold value Vth(i) (i=1, 2, ..., k) of the k TFTs. In this case, the outputs V(1) to V(k) of the circuit 201 are distributed in a manner shown by the variation δV in FIG. 2B where the center of the variation is at VG−V0.

That is, the circuit 201 shown in FIG. 2A is a circuit that outputs the outputs V(1) to V(k) that reflect the variations in the threshold values among the k TFTs 202(1) to 202(k). By assigning "1" to each output potential higher than VG−V0 and "0" to each output potential lower than VG−V0 using the circuit 201, for instance, it becomes possible to generate a number that reflects the variations in characteristics among the TFTs 202(1) to 202(k) and is proper to a substrate on which the circuit 201 has been formed.

It is possible to produce a substrate identification circuit by setting a proper number generated in this manner as the identification number of a substrate. For instance, there may be used a construction where a judgment is made by comparing the proper number generated by the circuit 201 with data of an identification number inputted from the outside. Alternatively, there may be used a construction where the proper number generated by the circuit 201 is simply outputted as an identification number.

In reality, however, all of TFTs produced on an insulating substrate exhibit variations in their characteristics, so that there occurs a problem to be described below in the case where the substrate identification circuit described above that uses the aforementioned scheme is realized as it is.

That is, the substrate identification circuit described above adopts a scheme with which a one-bit random number is assigned based on respective characteristic variations among the TFTs 202(1) to 202(k), although it is difficult to extract respective characteristic variations among the TFTs in actual cases. This is because in the case where "0" or "1" is assigned to a potential having a continuous distribution such as the distribution shown in FIG. 2B, for instance, it is required to use a differential amplification circuit but this differential amplification circuit is also influenced by the characteristic variations among the TFTs.

In order to solve this problem, the substrate identification circuit of the present invention does not adopt a scheme with which a one-bit random number is assigned by extracting respective characteristic variations among TFTs but adopts a scheme with which a one-bit random number is assigned to the overall of a circuit constructed from a plurality of TFTs. In the present invention, this circuit constructed from a plurality of TFTs is referred to as the "proper bit generating circuit". This proper bit generating circuit is characterized in that one-bit random number (hereinafter referred to as the "proper bit") is outputted based on all of the characteristic variations among the plurality of TFTs that are construction elements. The proper bit generating circuit is also characterized in that this circuit does not output an analog signal like that shown in FIG. 2B but outputs a one-bit digital signal.

The number proper to a substrate is generated by combining proper bits outputted from proper bit generating circuits. In the present invention, a number proper to a substrate obtained by combining a plurality of proper bits is referred to as the "proper word" and a circuit that outputs the proper word is referred to as the "proper word generating circuit".

If the proper word generating circuit that is a construction element of the substrate identification circuit of the present invention is written using a simple block diagram, this circuit is expressed in the manner shown in FIG. 3. In FIG. 3, a proper word generating circuit 101 is constructed from k (k is a natural number) proper bit generating circuits 102(1) to 102(k). The proper bit generating circuits 102(1) to 102(k) respectively output proper bits Did(1) to Did(k), and the proper word generating circuit 101 outputs a k-bit proper word (Did(1), ..., Did(k)).

It should be noted here that the proper word generating circuit 101 receives input of power supplies VDD and GND. Also, as required, an input potential Vin for adjustment is inputted thereinto. A case where one input potential Vin for adjustment is inputted is shown in FIG. 3, although there occurs no problem even if there are inputted a plurality of input potentials (Vin(1), Vin(2), ...).

The substrate identification circuit of the present invention includes the proper word generating circuit as a construction element and is characterized in that a proper word that is a number proper to a substrate is set as the identification number of the substrate. The substrate identification circuit may use a construction where a judgment is made by comparing the proper word with data of an identification number inputted from the outside. Alternatively, the substrate identification circuit may use a construction where the proper word is simply outputted as an identification number.

The substrate identification circuit of the present invention constructed in the manner described above generates a number proper to a substrate based on characteristic variations among TFTs, so that it becomes unnecessary to change a mask for each substrate, unlike in the case of a mask ROM. In addition, it is difficult to rewrite or duplicate the proper number.

It should be noted here that it is not required that a one-bit signal (Hi/Lo potential or 0/1 potential) precisely matches the power supply VDD or GND. It is sufficient that one-bit signal has a potential within a range where logic circuits, such as an inverter, a NAND circuit, and a NOR circuit, are capable of judging whether the signal is Hi or Lo even if consideration is given to characteristic variations among TFTs constituting the logic circuits.

Also, it does not matter whether the characteristic variations among the TFTs are caused by impurities or are caused by devices. In particular, in the case where a polycrystalline semiconductor is used as the active layers of the TFTs, characteristic variations caused by the grain patterns in active regions are also important. The characteristic variations resulting from the grain patterns depend on the generation of nuclei and the growth of grains and it is possible to obtain characteristic variations that are substantially random, so that these variations are preferable in the case where the variations are used to generate a number proper to a substrate.

As to the characteristic variations resulting from the grain patterns, it is possible to somewhat control the degree of the variations based on relations between a TFT size and a typical grain size. In the case where the TFT size is far larger than the typical grain size, a large number of grains exist in the channel region of each TFT, so that the variations resulting from the grains are averaged and become small. On the other hand, in the case where the TFT size is approximately equal to the typical grain size, the channel region of each TFT is constructed from a small number of grains, so that there occur great characteristic variations. Also, in the case where the TFT size is far smaller than the typical grain size, most TFTs are formed by a single grain, although grain boundaries exist in the channel regions of some TFTs and therefore their characteristics greatly vary and exhibit unbalanced characteristic variations. Accordingly, it is preferable that the size of TFTs forming the proper bit generating circuit is approximately equal to the typical grain size.

It should be noted here that in the case where grains exist while extending in one direction, the width in the minor axis direction is set as approximately equal to the TFT size.

In the present invention, the identification number of a substrate is randomly generated based on variations among TFTs, so that if the number of bits of the substrate identification number is small, it becomes difficult to identify a large number of substrates. It can be seen from the following discussion that in actuality, it is possible to identify a sufficient number of substrates with substrate identification numbers composed of around 100 bits.

When the number of bits of the identification number of a substrate is referred to as "n", there is generated one of $2^n$ possible identification numbers. It can be seen that even if the number of substrates that should be identified is set at $10^{10}$ (>population all over the world) and a sufficient margin is maintained by multiplying $10^{10}$ by $10^8$ with consideration given to a possibility that the same identification number is generated because the identification numbers are formed in a random manner, it is sufficient that there are used identification numbers whose number of bits is around 60 bits (up to $\log_2(10^{18})$ bits).

It should be noted here that the substrate identification circuit of the present invention is characterized in that there are utilized TFT characteristics, so that the identification number depends on the temperature and other environments to some extent. That is, there also exist proper bit generating circuits whose output values (0/1) vary with respect to environmental variations. However, there occurs no problem if design work is performed so that there are obtained proper bits, which do not vary with respect to the environmental variations and whose number is sufficient to perform substrate identification, and there is used a construction where the substrate identification is performed using the proper bits that do not vary with respect to the environmental variations.

It should be noted here that by producing the proper bit generating circuits using a construction where there are reflected variations among TFTs having the same size or polarity, it becomes possible to generate proper bits that are not so influenced by the environmental variations concerning the temperature and the like. This is because TFTs having the same size and polarity exhibit the same characteristic variation with respect to the environmental variations concerning the temperature and the like.

It should be noted here that in this specification, the term "semiconductor device" refers to the whole of devices that operate by utilizing semiconductor characteristics and includes, for instance, a semiconductor display apparatus (typified by a liquid crystal display device or a light emitting device) and an electronic equipment having a semiconductor display portion. Note that the semiconductor display portion refers to a display portion produced by forming electrodes or thin-film transistors on a substrate having an insulating surface and includes, for instance, a liquid crystal display portion, a light emitting display portion, a passive matrix type display portion, and an active matrix type display portion. Note that in obvious cases, the semiconductor display portion is also simply referred to as the "display portion".

Also, the term "thin-film transistor (TFT)" refers to the whole of transistors formed using an SOI technique.

Constructions of the present invention will be described below.

A substrate identification circuit according to the present invention is formed on a substrate having an insulating surface, which includes a plurality of first circuits. Note that, the first circuit is a proper bit generating circuit or the like. Each of the plurality of first circuits are constructed from a plurality of TFTs and each circuit outputs a one-bit random number based on variations in characteristics among the plurality of TFTs. Then, a numeric value proper to the substrate is generated using the plurality of one-bit random numbers.

A substrate identification circuit according to the present invention is formed on a substrate having an insulating surface, which includes a plurality of first and second circuits. Note that, the first circuit is a proper bit generating circuit or the like and the second circuit is a determining circuit or the like. Each of the plurality of first circuits are constructed from a plurality of TFTs and each circuit outputs a one-bit random number based on variations in characteristics among the plurality of TFTs. Then, a numeric value proper to the substrate is generated using the plurality of one-bit random numbers. The second circuit compares the numeric value proper to the substrate with a numeric value inputted from the outside.

A substrate identification circuit according to the present invention is formed on a substrate having an insulating surface, which includes a plurality of first circuits. Note that, the first circuit is a proper bit generating circuit or the like. Each of the plurality of first circuits is constructed from a plurality of TFTs and each circuit outputs a one-bit random number based on variations in threshold values among the plurality of TFTs. Then, a numeric value proper to the substrate is generated using the plurality of one-bit random numbers.

A substrate identification circuit according to the present invention is formed on a substrate having an insulating surface, which includes a plurality of first and second circuits. Note that, the first circuit is a proper bit generating circuit or the like and the second circuit is a determining circuit or the like. Each of the plurality of first circuits are constructed from a plurality of TFTs and each circuit outputs a one-bit random number based on variations in threshold values among the plurality of TFTs. Then, a numeric value proper to the substrate is generated using the plurality of one-bit random numbers. The second circuit compares the numeric value proper to the substrate with a numeric value inputted from the outside.

A substrate identification circuit according to the present invention is formed on a substrate having an insulating surface, which includes a plurality of first circuits. Note that, the first circuit is a proper bit generating circuit or the like. Each of the plurality of first circuits is constructed from a plurality of TFTs, each of which includes an active layer formed using a plurality of polycrystalline semiconductor films, and a one-bit random number based on grain patterns of the active layers of the plurality of TFTs is outputted therefrom. Then, a numeric value proper to the substrate is generated using the plurality of one-bit random numbers.

A substrate identification circuit according to the present invention is formed on a substrate having an insulating surface, which includes a plurality of first and second circuits. Note that, the first circuit is a proper bit generating circuit or the like and the second circuit is a determining circuit or the like. Each of the plurality of first circuits is constructed from a plurality of TFTs, each of which includes an active layer formed using a plurality of polycrystalline semiconductor films, and a one-bit random number based on grain patterns of the active layers of the plurality of TFTs is outputted therefrom. Then, a numeric value proper to the substrate is generated using the plurality of one-bit random numbers. The second circuit compares the numeric value proper to the substrate with a numeric value inputted from the outside.

Each of the plurality of first circuits may include a differential amplification circuit as a construction element.

Each of the plurality of first circuits may include an inverter as a construction element.

There is provided a semiconductor device in which the substrate identification circuit and a pixel portion are integrally formed on the substrate.

There is provided a semiconductor device in which the substrate identification circuit, a pixel portion, and a driving circuit for driving the pixel portion are integrally formed on the substrate.

The semiconductor device may be a liquid crystal display apparatus.

The semiconductor device may be a light emitting apparatus.

There is provided a semiconductor device in which the substrate identification circuit and an operation processing circuit are integrally formed on the substrate.

There is provided a semiconductor device in which the substrate identification circuit and a memory are integrally formed on the substrate.

As a semiconductor device, there are provided a game machine, a video camera, a head mount type display, a DVD player, a personal computer, a mobile telephone, and a car audio equipment.

BRIEF DESCRIPTION OF THE DRAWINGS

FIGS. 15A to 15C show a manufacturing process of the semiconductor device of the present invention;

FIGS. 16A to 16C show the manufacturing process of the semiconductor device of the present invention;

FIGS. 17A and 17B show the manufacturing process of the semiconductor device of the present invention;

DETAILED DESCRIPTION OF THE PREFERRED EMBODIMENTS

In this embodiment mode, there will be described a typical circuit construction and operation of a substrate identification circuit having a k-bit (k is an integer at least equal to one) identification number. The following description will be made with reference to FIGS. 1, 4A, 4B, and 5.

Figure 1:
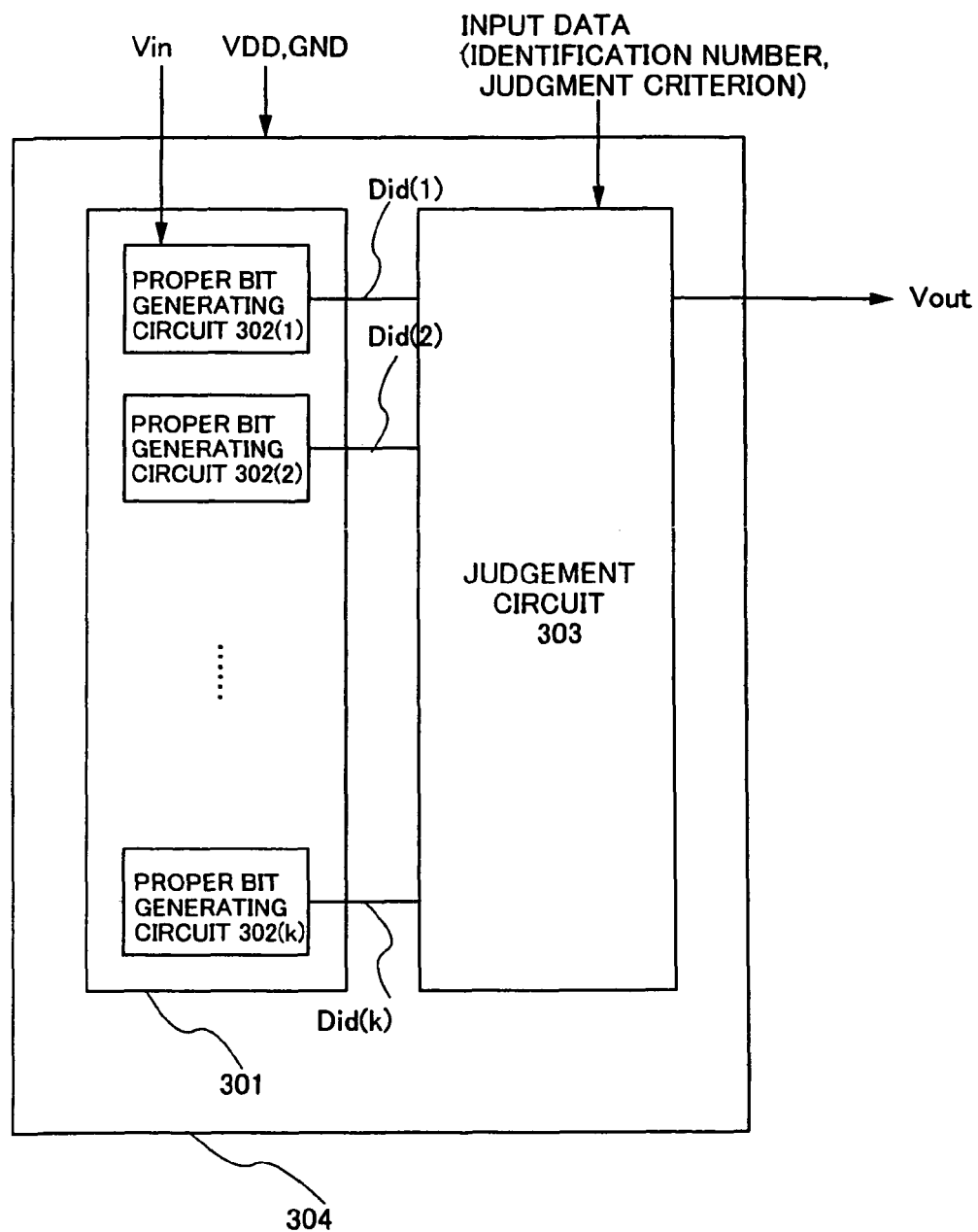
FIG. 1 is a block diagram of a substrate identification circuit of the present invention.
Figure 2A:
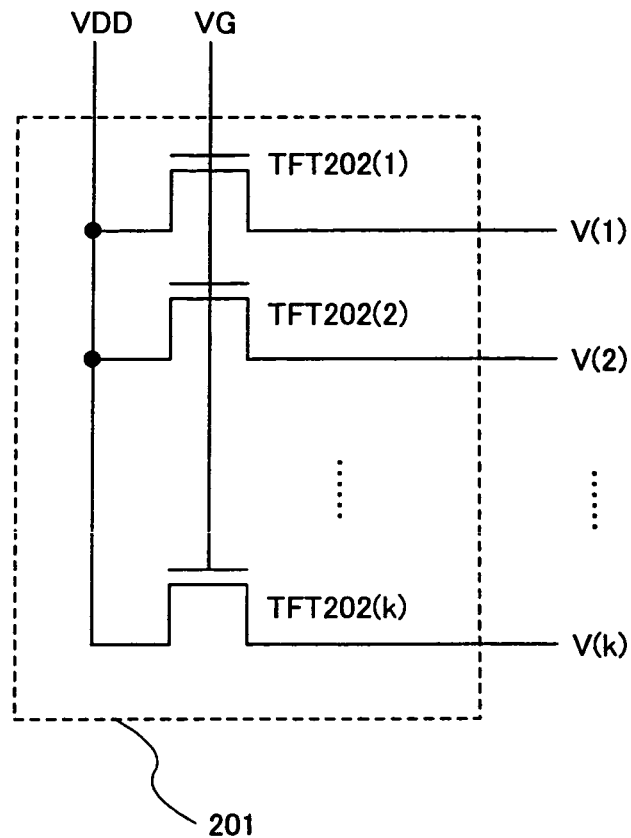
FIGS. 2A and 2B are a circuit diagram of a proper bit generating circuit and a profile of output variation among TFTs.
Figure 2B:
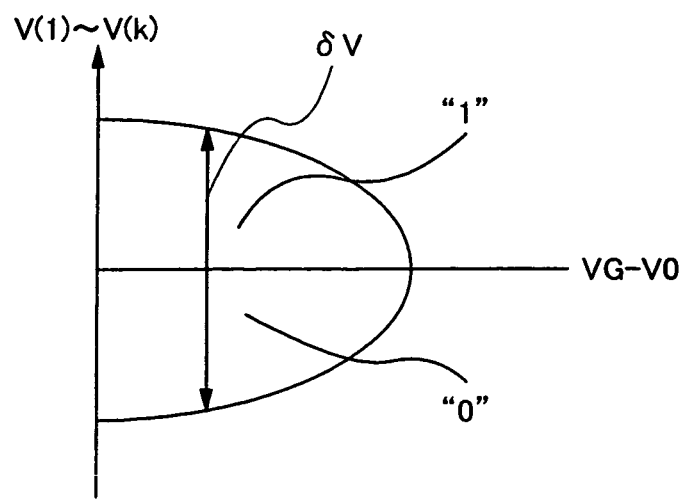
Figure 3:
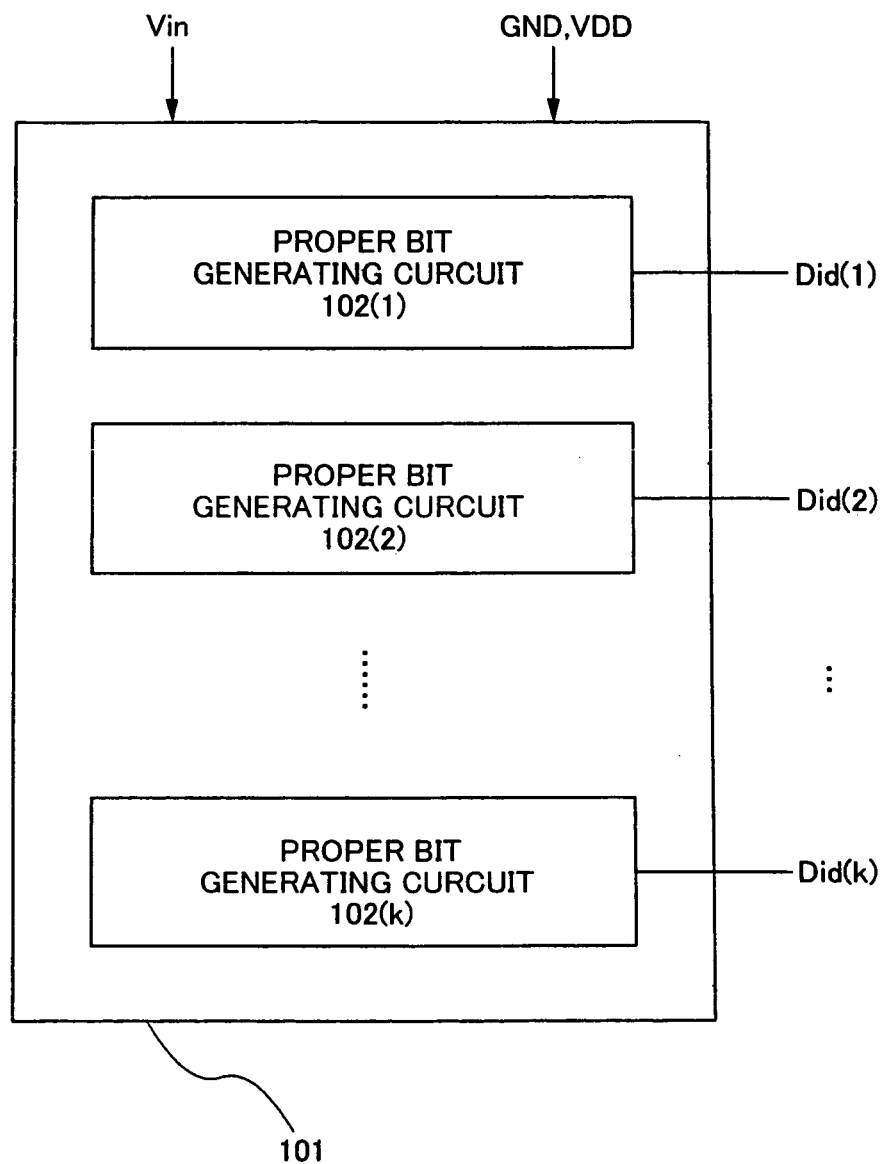
FIG. 3 is a block diagram of a proper word generating circuit that constitutes the substrate identification circuit of the present invention.

FIG. 1 is a block diagram of the substrate identification circuit of the present invention. In this embodiment mode, as a typical construction of the substrate identification circuit, there will be discussed a substrate identification circuit having a construction where a signal concerning an identification number and a judgment criterion and a signal for adjustment are received as input signals and there is outputted a judgment result that expresses whether or not the identification number matches a proper word.

In FIG. 1, a substrate identification circuit 304 is constructed from a proper word generating circuit 301 and a judgment circuit 303. Also, the substrate identification circuit 304 receives input of power supplies VDD and GND, a potential Vin for adjustment, and input data that is a signal that determines an identification number and a judgment criterion, and outputs Vout as a judgment result.

The proper word generating circuit 301 is constructed from k proper bit generating circuits (first circuits) 302(1) to 302(k). The proper word generating circuit 301 also outputs a k-bit proper word (Did(1), . . . , Did(k)) that reflects characteristic variations among a plurality of TFTs. The proper word generating circuit 301 further receives input of the power supplies VDD and GND and the potential Vin for adjustment.

The judgment circuit (second circuit) 303 is a circuit that makes a judgment by comparing the proper word (Did(1), . . . , Did(k)) outputted from the proper word generating circuit 301 with the identification number inputted from the outside. The judgment circuit also receives input of the signal that determines a judgment criterion from the outside. The judgment circuit then outputs a judgment result as Vout.

Next, there will be described the circuit constructions of the proper bit generating circuits 302 and the judgment circuit 303 constituting the substrate identification circuit 304.

Figure 4A:
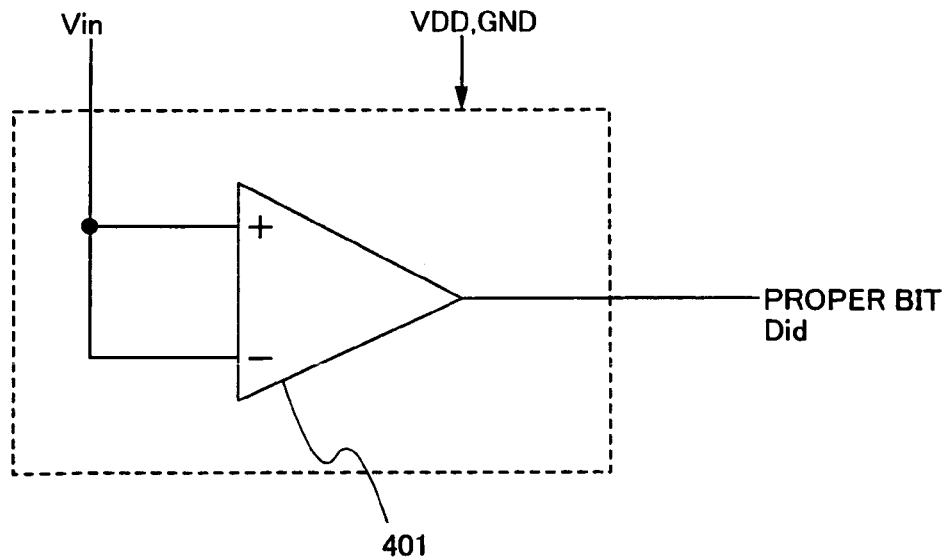
FIGS. 4A and 4B are circuit diagrams of proper bit generating circuits constituting the substrate identification circuit of the present invention.
Figure 4B:
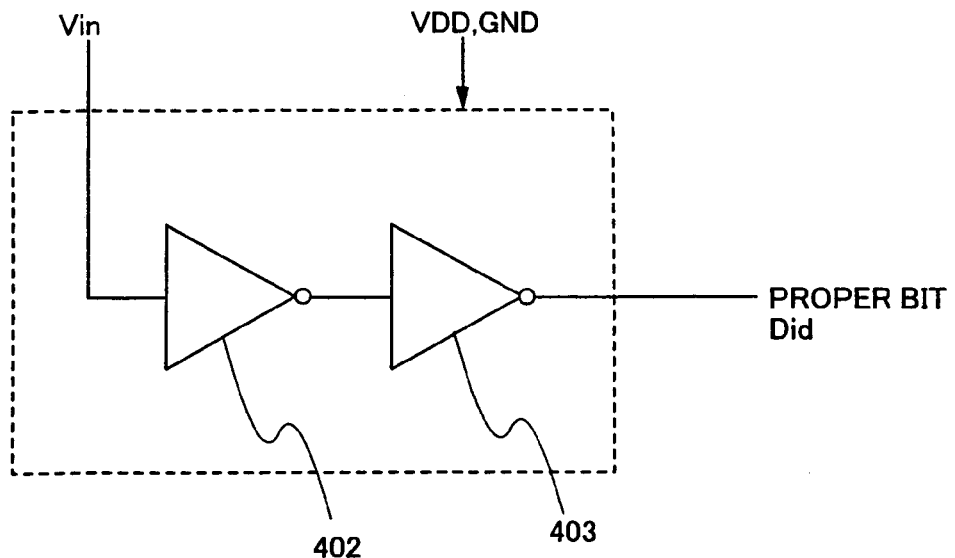

FIGS. 4A and 4B each show a typical circuit construction of the proper bit generating circuits (first circuits).

FIG. 4A shows a circuit in which a common potential Vin is connected to two input terminals of a differential amplification circuit 401. The differential amplification circuit 401 is a circuit that outputs Hi or Lo in accordance with a relation in magnitude between potentials applied to the two input terminals. Accordingly, when a common potential is inputted to the two input terminals of the differential amplification circuit 401 and there is disregarded variations among TFTs constituting the differential amplification circuit 401, an intermediate potential is outputted. In reality, however, the TFTs constituting the differential amplification circuit 401 exhibit variations in their characteristics, so that such an intermediate potential is not outputted and a Hi or Lo signal is outputted in accordance with the variations among the TFTs constituting the differential amplification circuit 401.

That is, the proper bit generating circuit shown in FIG. 4A outputs a Hi or Lo signal (proper bit) based on the characteristic variations among the TFTs constituting the differential amplification circuit 401.

It should be noted here that the differential amplification circuit 401 may be a circuit of any publicly known type. Also, a case where a common potential is applied to the two input terminals of the differential amplification circuit 401 is shown in FIG. 4A, although different potentials may be applied to the two input terminals.

FIG. 4B shows a circuit in which inverters 402 and 403 are connected in series and the inverter 402 at the first stage receives input of the potential Vin. The inverters are circuits that each invert an input potential (Hi or Lo) and output the inverted potential, so that in the case where an intermediate potential is inputted as Vin, if characteristic variations among TFTs constituting the inverters are disregarded, there is outputted an intermediate potential. In reality, however, variations exist in the characteristics of the TFTs constituting the inverters, so that such an intermediate potential is not outputted and a Hi or Lo signal is outputted in accordance with the variations among the TFTs constituting the inverters 402 and 403.

That is, the proper bit generating circuit shown in FIG. 4B outputs a Hi or Lo signal (proper bit) based on the characteristic variations among the TFTs constituting the inverters 402 and 403.

It should be noted here that a case where the number of stages of the inverters is two is shown in FIG. 4B, although the number of stages of the inverters is not limited to this and any other number of stages may be used so long as the number of stages is at least equal to one. Also, there may be used a circuit where buffer circuits are connected in series in place of the inverters. The inverter circuits and the buffer circuits may be realized using any publicly known circuits.

However, in the case where the number of stages of the inverters or buffer circuits is small, there is a possibility that the output potential is not sufficiently shifted to the Hi or Lo side and becomes an intermediate potential. Whether or not the output potential becomes an intermediate potential is determined by a balance among variations in TFT characteristics and the characteristics of the inverters or buffer circuits, and it is preferable that the number of stages of the inverters or buffer circuits is a number of stages with which the output becomes a digital signal.

Figure 5:
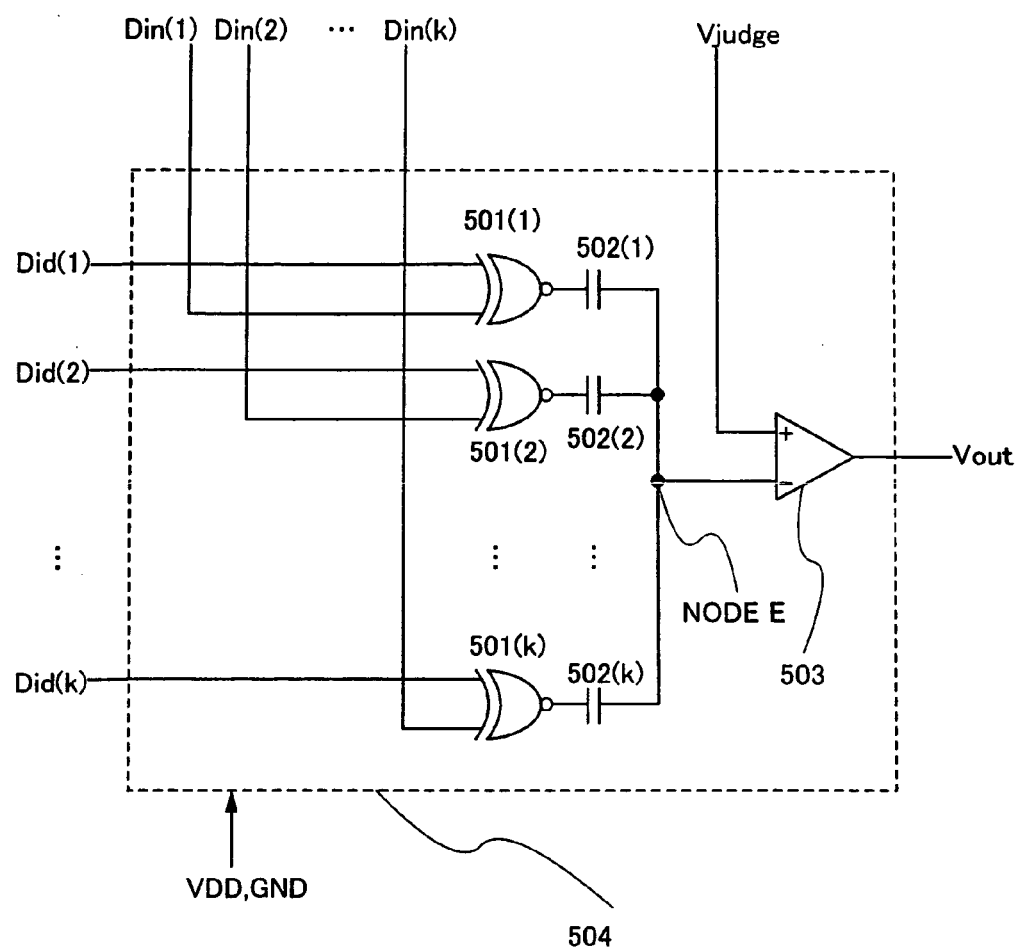
FIG. 5 is a circuit diagram of a judgment circuit constituting the substrate identification circuit of the present invention.

Next, there will be described a circuit construction of the judgment circuit (second circuit). FIG. 5 shows an example of the judgment circuit.

In FIG. 5, a judgment circuit 504 receives input of a k-bit proper word (Did(1), Did(2), . . . , Did(k)), a k-bit identification number (Din(1), Din(2), . . . , Din(k)), and a signal Vjudge that determines the judgment criterion, and outputs Vout. The judgment circuit 504 is constructed from k EXNOR circuits 501(1) to 501(k), k capacitor elements 502(1) to 502(k) whose capacities are equal to each other, and a differential amplification circuit 503.

Each bit (referred to as the "i-th bit" in the following description, with "i" being an integer in a range of from one to k) of the proper word and its corresponding bit of the identification number inputted into the judgment circuit 504 are inputted into the EXNOR circuit 501(i) and its output is connected to one of terminals of the capacitor element 502(i). The remaining terminals of the capacitor elements 502(1) to 502(k) are connected to each other and are also connected to one of input terminals of the differential amplification circuit 503. This node is referred to as the "node E" and the potential thereof is referred to as "VE". The other of the input terminals of the differential amplification circuit 503 receives input of the signal Vjudge that determines the judgment criterion and the differential amplification circuit 503 outputs Vout as an output.

Each EXNOR circuit outputs Hi in the case where two inputs are equal to each other, and outputs Lo in the case where the two inputs are different from each other. Consequently, in the case where each bit of the k-bit proper word is compared with its corresponding bit of the k-bit identification number and it is found that h bits (h is an integer in a range of from one to k) among the k bits of the proper word matches their corresponding bits of the identification number, for instance, Hi is outputted from h EXNOR circuits among the EXNOR circuits 501(1) to 501(k) and Lo is outputted from the remaining (k-h) EXNOR circuits.

If the input capacity of the differential amplification circuit is sufficiently small in comparison with the capacitor elements 502(1) to 502(k), the potential VE at the node E is determined by the capacitor elements 502(1) to 502(k). It is assumed that h EXNOR circuits among the EXNOR circuits 501(1) to 501(k) output Hi, the remaining (k-h) EXNOR circuits output Lo, the potential of Hi is referred to as VDD, and the potential of Lo is set at 0 V, for instance. In this case, the potential VE at the node E becomes "VE=h/k×VDD".

The differential amplification circuit receives input of VE and Vjudge. In the case where VE>Vjudge, Hi is outputted as Vout. On the other hand, in the case where VE<Vjudge, Lo is outputted as Vout. That is, with reference to Vjudge functioning as a judgment criterion, it is judged that the proper word matches the identification number in the case where Vout is Hi and it is judged that the proper word does not match the identification number in the case where Vout is Lo.

In the case where Vjudge=¾×VDD, for instance, the judgment criterion is that at least 75% of bits of the proper word match their corresponding bits of the identification number. That is, in the case where each bit of the proper word is compared with its corresponding bit of the identification number and at least 75% of bits of the proper word match their corresponding bits of the identification number, Vout becomes Hi. On the other hand, in the case where a matching result is obtained only for 75% or less of the bits, Vout becomes Lo.

It should be noted here that the capacities of the k capacitor elements constituting the judgment circuit are set as equal to each other, although there occurs no problem even if the k capacitor elements have different capacities. If the k capacitor elements have different capacities, it becomes possible to change the weight of the judgment criterion for each bit. Also, for ease of explanation, there are disregarded the input capacitance and characteristic variations of the differential amplification circuit, although consideration may be given by taking them into account. It is possible to correct influences of the characteristic variations and input capacitance of the differential amplification circuit by changing the value of Vjudge, so that there occurs no problem if the judgment criterion is set with consideration given to these influences.

The substrate identification circuit of the present invention is constructed in the manner described above. Also, by integrally forming the aforementioned substrate identification circuit on a substrate having a pixel portion, a driving circuit for the pixel portion, or another logic circuit as well as an insulating surface, it becomes possible to assign a number proper to the TFT substrate.

There will be next described how the potential Vin for adjustment and the potential Vjudge that determines the judgment criterion should be set. The proper word depends on Vin and environments such as the temperature to some extent. This is because TFT characteristics depend on environmental variations. Therefore, the potential Vin for adjustment and the potential Vjudge that determines the judgment criterion should be determined with consideration given to these margins. If it is assumed that 60% of bits constituting the proper word do not vary in the case where Vin is in a range of 2.0±0.5 V and the temperature is in a range of −30 to 100° C., for instance, it is possible to perform substrate identification by setting Vin at 2 V and using Vjudge with which the judgment criterion is determined so that if a matching result is obtained for 60% or more of bits, it is judged that the proper word matches the identification number.

In this case, it is required that it is possible to identify a sufficient number of substrates with a number of bits that is 60% of bits constituting the proper word.

It should be noted here that in the case where it is only required to manage substrates, it is also possible to use only the proper word generating circuit as the substrate identification circuit. In this case, it is possible to perform the substrate management using an outputted proper word as an identification number. Also, in the case where the identification number of a substrate is used to selectively give a right to a specific TFT substrate, the substrate identification circuit described in this embodiment mode is implemented as a part of the system of the TFT substrate. For instance, by inputting an identification number, it becomes possible to use an output that is a judgment result as an enable signal for another logic circuit within the TFT substrate. It is also possible to use the output as an output signal to another IC chip within a semiconductor device or to a different semiconductor device.

Hereinafter, there will be described embodiments of the present invention.

Embodiments

First Embodiment

In this embodiment, there will be described a concrete circuit construction of the proper bit generating circuit described in the embodiment mode. The following description will be made with reference to FIG. 6.

Figure 6:
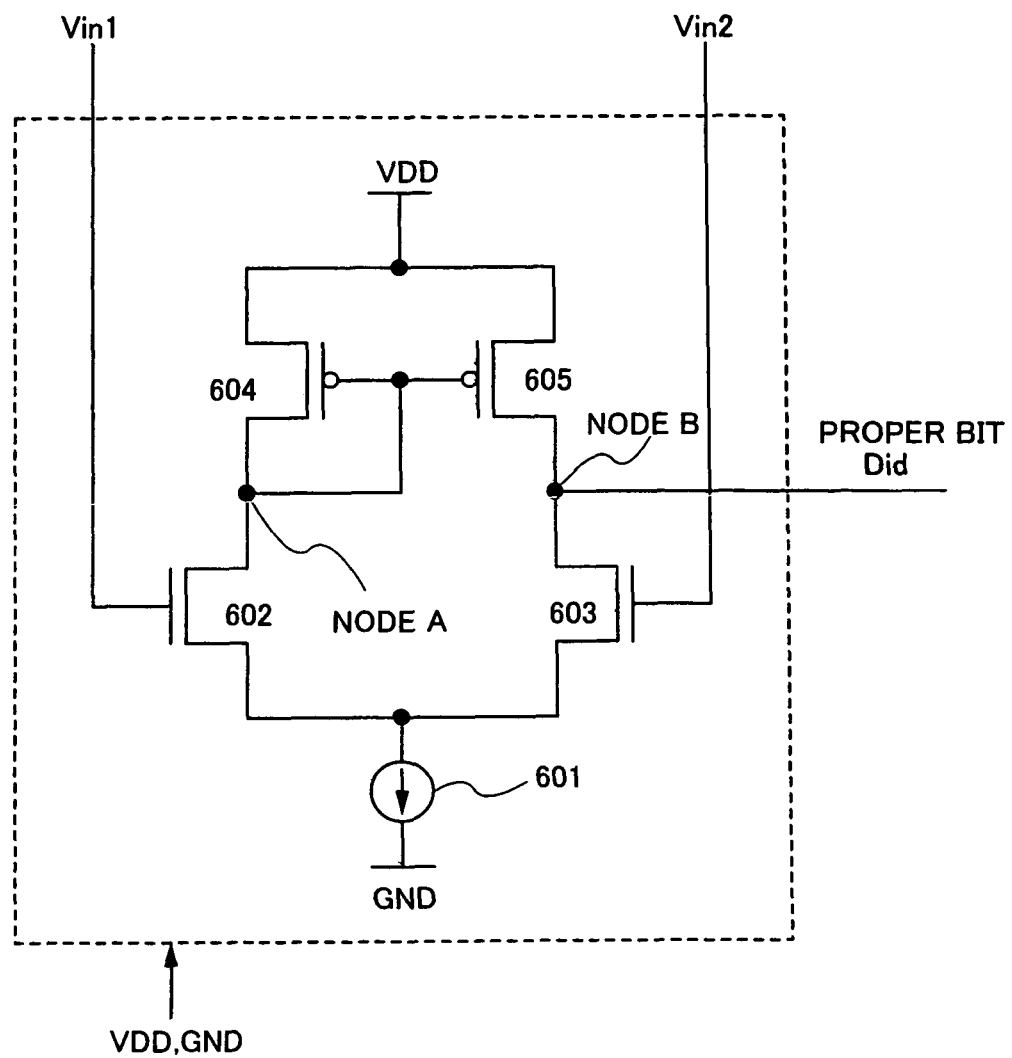
FIG. 6 is another circuit diagram of the proper bit generating circuit constituting the substrate identification circuit of the present invention.

The proper bit generating circuit shown in FIG. 6 receives input of potentials Vin1 and Vin2 and outputs a proper bit Did. In FIG. 6, the drain region of an N-channel type TFT 602 and the drain region of a P-channel type TFT 604 are connected to each other at a node A, while the drain region of the N-channel type TFT 603 and the drain region of the P-channel type TFT 605 are connected to each other at a node B. The source region of the N-channel type TFT 602 and the source region of the N-channel type TFT 603 are connected to each other and are connected to a constant current source. The source region of the P-channel type TFT 604 and the source region of the P-channel type TFT 605 are connected to each other and are connected to a power supply VDD. Also, the gate electrodes of the P-channel type TFTs 604 and 605 are connected to each other and are connected to the node A. The input potentials Vin1 and Vin2 are respectively connected to the gate electrodes of the N-channel type TFTs 602 and 603, while the proper bit Did that is an output potential is connected to the node B.

It should be noted here that in FIG. 6, the N-channel type TFTs 602 and 603 have the same size and the P-channel type TFTs 604 and 605 have the same size.

The proper bit generating circuit shown in FIG. 6 receives input of a potential that is common to the inputs Vin1 and Vin2, and outputs a proper bit that reflects variations among TFTs constituting the circuit in the manner described below.

For instance, the threshold voltages of the N-channel type TFTs 602 and 603 are respectively referred to as VthN1 and VthN2, the threshold voltages of the P-channel type TFTs 604 and 605 are respectively referred to as VthP1 and VthP2, and it is assumed that the constant current source is an ideal constant current source. In this case, under a condition of Vin1=Vin2, the output is determined by relations among the four threshold values that are determined by variations among the TFTs. If the four threshold values are in relations of "VthN1>VthN2" and "VthP1=VthP2", the output becomes Lo. Also, if there exist relations of "VthN1<VthN2" and "VthP1=VthP2", the output becomes Hi. Further, if there exist relations of "VthN1=VthN2" and "VthP1>VthP2", the output becomes Lo. Also, if there exist relations of "VthN1=VthN2" and "VthP1<VthP2", the output becomes Hi. The actual output is, however, determined by a factor that also includes a combination of these, variations of the constant current source, and the like.

In the case where Vin1=Vin2, the proper bit generating circuit shown in FIG. 6 generates a proper bit that reflects only differences in characteristics among TFTs having the same size and polarity, that is, differences in characteristics between the N-channel type TFTs 602 and 603 and differences in characteristics between the P-channel type TFTs 604 and 605. Therefore, the dependency of the proper bit on the changing of environments and Vin1 (=Vin2) becomes small.

It should be noted here that there has been described a construction where Vin1 and Vin2 are separately inputted as the input for adjustment, although there occurs no problem even if Vin1 and Vin2 are set at the same potential and are merged into a single input.

Also, an inverter, or a circuit in which a plurality of inverters are connected in series, may be connected to the output terminal.

Second Embodiment

In this embodiment, as a concrete circuit construction of the proper bit generating circuit, there will be described an example that is different from that in the first embodiment. The following description will be made with reference to FIG. 7.

Figure 7:
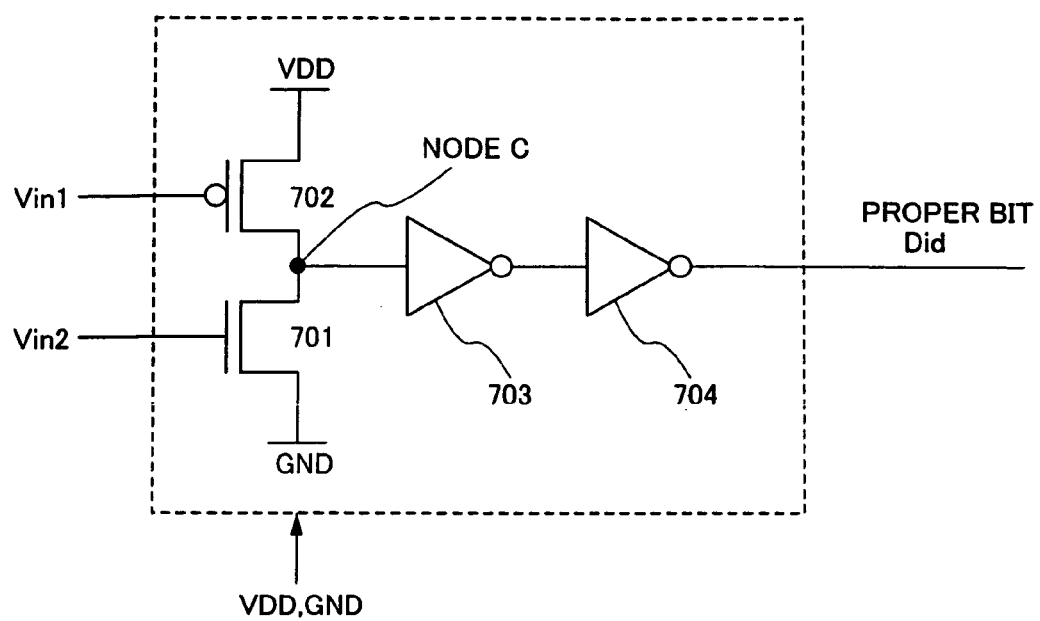
FIG. 7 is still another circuit diagram of the proper bit generating circuit constituting the substrate identification circuit of the present invention.

The proper bit generating circuit shown in FIG. 7 receives input of potentials Vin1 and Vin2 and outputs a proper bit Did. In FIG. 7, the drain region of an N-channel type TFT 701 and the drain region of a P-channel type TFT 702 are connected to each other at a node C. The node C is connected to the input terminal of an inverter 703 and this inverter 703 is connected to another inverter 704 in series. The inputs Vin1 and Vin2 into the proper bit generating circuit are respectively connected to the gate electrode of the P-channel type TFT 702 and the gate electrode of the N-channel type TFT 701, and the proper bit Did that is an output from the proper bit generating circuit is connected to the output terminal of the inverter 704.

When appropriate potentials are inputted as the inputs Vin1 and Vin2, the proper bit generating circuit shown in FIG. 7 outputs a proper bit that reflects variations among TFTs constituting the circuit in the manner described below.

As to the potentials inputted as the inputs Vin1 and Vin2, there are inputted potentials with which an intermediate potential appears at the node C in the case where the N-channel type TFT 701 and the P-channel type TFT 702 have average characteristics.

For instance, the threshold value of the N-channel type TFT 701 is referred to as VthN, the threshold value of the P-channel type TFT 702 is referred to as VthP, and it is assumed that the inverters 703 and 704 are ideal inverters. Also, the average of threshold values of N-channel type TFTs is referred to as VthN0 and the average of threshold values of P-channel type TFTs is referred to as VthP0.

In this case, the output is set at Hi or Lo in accordance with relations between the two threshold values and the average threshold values, with the relations being influenced by variations among the TFTs. If the threshold values are in relations of "VthN>VthN0" and "VthP=VthP0", the output becomes Hi. Also, if there exist relations of "VthN<VthN0" and "VthP=VthP0", the output becomes Lo. Further, if there exist relations of "VthN=VthN0" and "VthP>VthP0", the output becomes Hi. Also, if there exist relations of "VthN=VthN0" and "VthP<VthP0", the output becomes Lo. The actual output is, however, determined by a factor that also includes a combination of these and variations of the inverters 703 and 704.

It should be noted here that there has been described a construction where Vin1 and Vin2 are separately inputted as the input for adjustment, although there occurs no problem even if Vin1 and Vin2 are set as the same potential and are merged into a single input.

It should also be noted here that the number of stages of the inverters is not limited to two and may be set at any other number.

Third Embodiment

In this embodiment, as a concrete circuit construction of the proper word generating circuit, there will be described an example that is different from that in the embodiment mode. The following description will be made with reference to FIG. 8.

Figure 8:
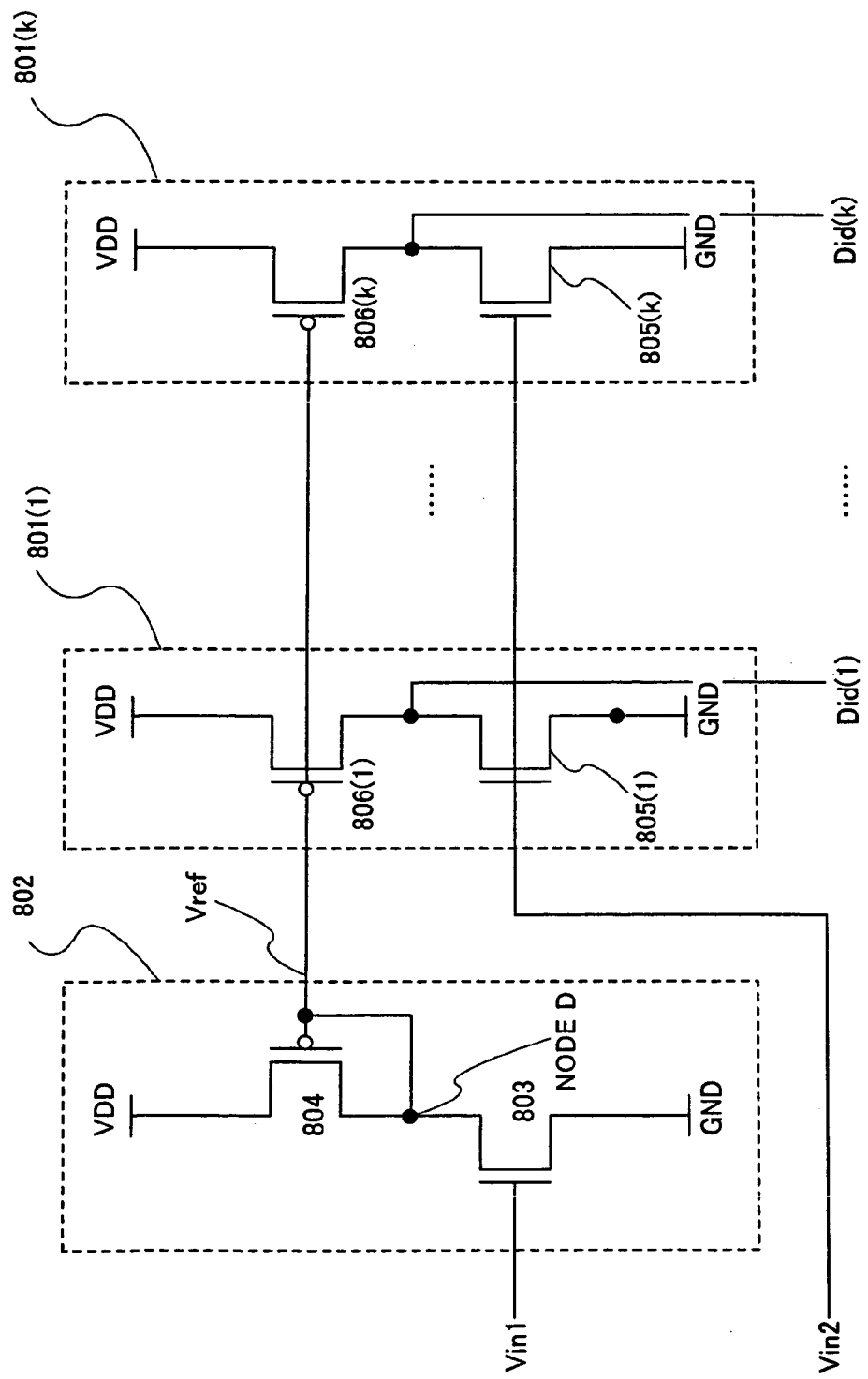
FIG. 8 is another circuit diagram of the proper word generating circuit constituting the substrate identification circuit of the present invention.

In FIG. 8, there is shown a proper word generating circuit that receives input of potentials Vin1 and Vin2 and outputs a k-bit (k is an integer at least equal to one) proper word (Did(1), . . . , Did)k). The proper word generating circuit shown in FIG. 8 is constructed from a reference voltage generating circuit 802 and k proper bit generating circuits 801(1) to 801(k). The k proper bit generating circuits 801(1) to 801(k) are each constructed from a pair of an N-channel type TFT and a P-channel type TFT [805(1), 806(1)] to [805(k), 806(k)], and the circuit construction thereof is identical to the construction shown in FIG. 7 from which the inverters 703 and 704 are removed. Also, the operation thereof is the same as that described in the second embodiment and therefore the description thereof is omitted in this embodiment.

This embodiment is characterized in that the output from the reference voltage generating circuit 802 is applied to one of input terminals of the proper bit generating circuits. The reference voltage generating circuit 802 has a construction where the drain region of an N-channel type TFT 803 and the drain region of a P-channel type TFT 804 are connected to each other at a node D. The source region of the N-channel type TFT 803 is connected to GND and the source region of the P-channel type TFT 804 is connected to VDD. Also, connected to the gate electrode of the N-channel type TFT 803 is the input potential Vin1. Further, the gate electrode of the P-channel type TFT 804 is connected to the node D and is outputted as a reference potential Vref.

It should be noted here that in FIG. 8, the N-channel type TFT 803 and the N-channel type TFTs 805(1) to 805(k) have the same size and the P-channel type TFT 804 and the P-channel type TFTs 806(1) to 806(k) have the same size.

On receiving input of a potential that is common to the inputs Vin1 and Vin2, the proper word generating circuit shown in FIG. 8 outputs a proper word that reflects variations among the TFTs constituting the circuit.

In the following description, only Did(1) that is the first bit of the proper word will be discussed. If the threshold voltages of the N-channel type TFTs 803 and 805(1) are respectively referred to as VthN1 and VthN2 and the threshold voltages of the P-channel type TFTs 804 and 806(1) are respectively referred to as VthP1 and VthP2, for instance, the output is set at Hi or Lo in accordance with relations among the four threshold values that are influenced by variations among the TFTs. That is, if the four threshold values are in relations of "VthN1>VthN2" and "VthP1=VthP2", the output becomes Lo. Also, if there exist relations of "VthN1<VthN2" and "VthP1=VthP2", the output becomes Hi. Further, if there exist relations of "VthN1=VthN2" and "VthP1>VthP2", the output becomes Lo. Also, if there exist relations of "VthN1=VthN2" and "VthP1<VthP2", the output becomes Hi. The actual output is, however, determined by a combination of these.

Also, the same applies to the i-th bit Did(i) of the proper word.

It should be noted here that in FIG. 8, there may be constructed a proper word generating circuit, which receives input of the reference voltage Vref and Vin2, by removing the reference voltage generating circuit 802. In this case, there is generated a proper word that reflects differences in characteristics between the TFT 805(i) and the TFT 806(i) having different polarities.

In the case where Vin1=Vin2, the proper word generating circuit shown in FIG. 8 generates proper bits that reflect only differences in characteristics among TFTs having the same size and polarity, that is, differences in characteristics between the N-channel type TFTs 803 and 805(*i*) and differences in characteristics between the P-channel type TFTs 804 and 806(*i*). As a result, when compared with a case where there is not provided the reference voltage generating circuit 802, it becomes possible to reduce the dependency of proper bits on the changing of environments and Vin1 (=Vin2).

It should be noted here that there has been described a construction where Vin1 and Vin2 are separately inputted as the input for adjustment, although there occurs no problem even if Vin1 and Vin2 are set at the same potential and are merged into a single input.

Also, an inverter, or a circuit in which a plurality of inverters are connected in series, may be connected to the output terminal.

Fourth Embodiment

In this embodiment, there will be described a circuit construction that is different from that of the judgment circuit described in the embodiment mode. The following description will be made with reference to FIG. 9.

In the embodiment mode, an analog signal Vjudge is inputted as the judgment criterion and it is judged whether a proper word matches an inputted identification number using the differential amplification circuit that is an analog circuit. In this embodiment, however, there will be described an example where a digital signal is inputted as the judgment criterion and the judgment is entirely made using a digital circuit.

Figure 9:
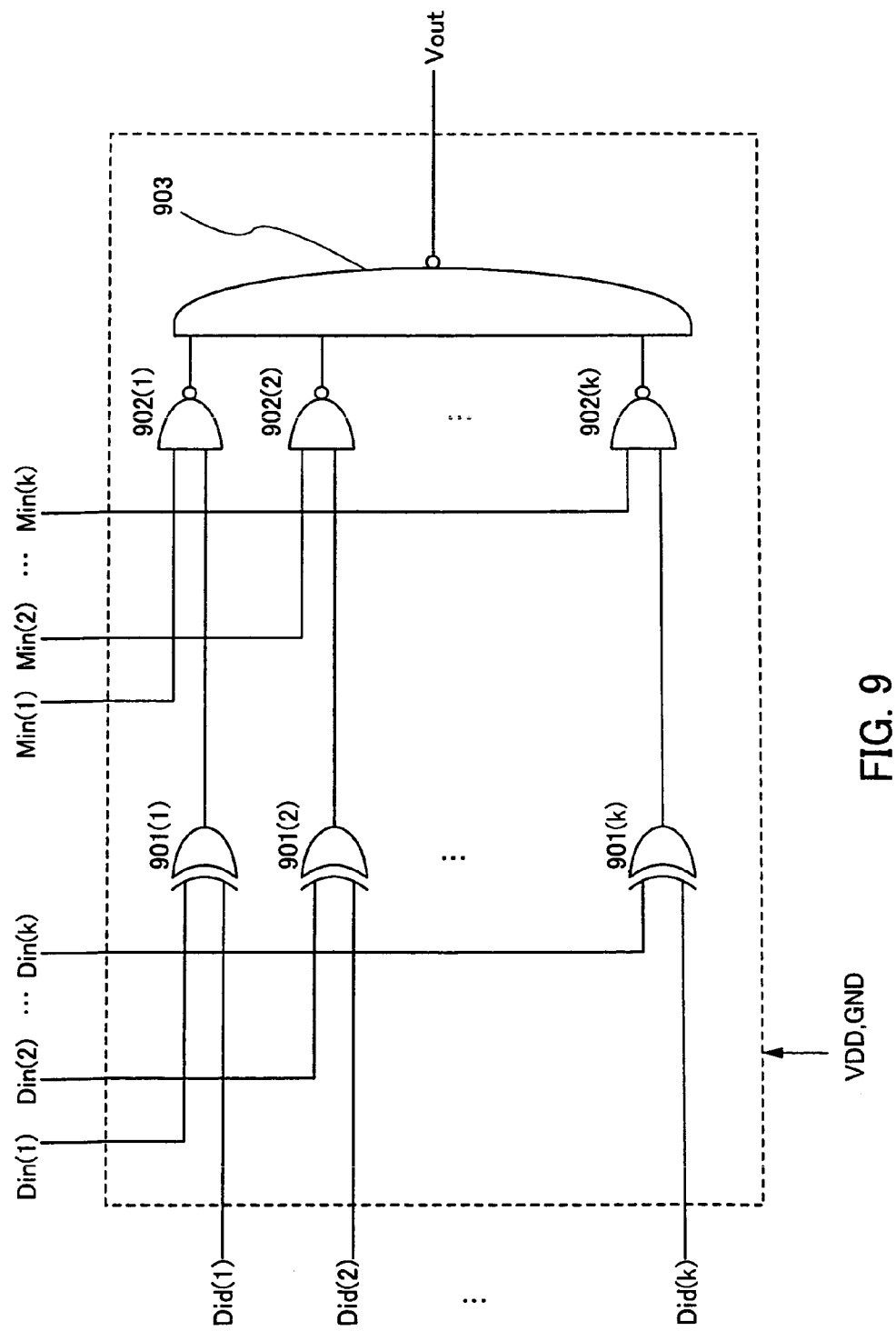
FIG. 9 is another circuit diagram of the judgment circuit constituting the substrate identification circuit of the present invention.

The judgment circuit shown in FIG. 9 receives input of a k-bit proper word (Did(1), Did(2), . . . , Did(k)), a k-bit identification number (Din(1), Din(2), . . . , Din(k)), and a digital signal (Min(i), Min(2), . . . , Min(k)) that determines the judgment criterion, and outputs Vout. The judgment circuit is constructed from k EXNOR circuits 901(1) to 901(*k*), k NAND circuits 902(1) to 902(*k*), and a NAND circuit 903 having k input terminals.

Each bit (referred to as the i-th bit in this embodiment, with "i" being an integer in a range of from one to k) of the proper word and its corresponding bit of the identification number inputted into the judgment circuit are inputted into the EXNOR circuit 901(*i*) and its output is connected to one of terminals of the NAND circuit 902(*i*). The other of the terminals of the NAND circuit 902(*i*) receives input of a digital signal Min(i) that determines the judgment criterion. The output from the NAND circuit 902(*i*) is inputted into the NAND circuit 903 and the output from the NAND circuit 903 is outputted from the judgment circuit as Vout.

Each EXNOR circuit outputs Hi in the case where two inputs are equal to each other, and outputs Lo in the case where the two inputs are different from each other. Accordingly, in the case where each bit of the k-bit proper word is compared with its corresponding bit of the k-bit identification number and a matching result is obtained for h bits (h is an integer in a range of from one to k) among the k bits, for instance, h EXNOR circuits among the EXNOR circuits 901(1) to 901(*k*) output Hi and the remaining (k-h) EXNOR circuits output Lo.

There is inputted "0" or "1" as each digital signal Min(i) that determines the judgment criterion. In the case where "0" is inputted as Min(i), the output from the NAND circuit 902(*i*) becomes "1" irrespective of the output from the EXNOR circuit 901(*i*). Also, in the case where "1" is inputted as Min(i), the output from the NAND circuit 902(*i*) becomes an inverted signal of the output from the EXNOR circuit 901(*i*).

Then, the judgment circuit outputs "0" as the output Vout only in the case where all of the outputs from the NAND circuits 902(*i*) are "1". That is, only in the case where Did(i) matches Din(i) in each bit whose signal Min(i) is "1", "0" is outputted.

In other words, it is possible to determine the judgment criterion by comparing each bit of the proper word with its corresponding bit of the inputted identification number, inputting "0" in each bit of the digital signal (Min(1), Min(2), . . . , Min(k)) for which it is not required that a matching result is obtained, and inputting "1" in each bit thereof for which it is required that a matching result is obtained.

It is judged that the proper word matches the identification number in the case where Vout is "0", and it is judged that the proper word does not match the identification number in the case where Vout is "1".

In the case where "1" is inputted into only the third bit Min(3) of the digital signal (Min(1), Min(2), . . . , Min(k)) and "0" is inputted into other bits thereof, for instance, there is obtained a judgment criterion with which Vout becomes "0" in the case were the proper word all matches the identification number except for the third bit and Vout becomes "1" in other cases.

The judgment circuit constructed in this manner is entirely a digital circuit, so that this circuit is not influenced by characteristic variations of TFTs.

It is sufficient that the method of setting the digital signal (Min(1), Min(2), . . . , Min(k)) that determines the judgment criterion is determined with consideration given to, for instance, dependency on the potential Vin for adjusting the proper word and environments such as the temperature. For instance, the digital signal Min(i) is set at "0" for each bit of the proper word that varies if the temperature is in a range of −30 to 100° C. and the digital signal Min(i) is set at "1" for each bit of the proper word that does not vary in this temperature range. In this case, it is possible to perform the substrate identification by judging whether a matching result is obtained only for all of bits of the proper word that do not vary if the temperature is in the range of −30 to 100° C.

It should be noted here that it is possible to freely combine this embodiment with the first to third embodiments.

Fifth Embodiment

In this embodiment, there will be described a circuit construction that is different from that of the substrate identification circuit described in the embodiment mode. The following description will be made with reference to FIG. 10.

In the embodiment mode, as a form of the substrate identification circuit, there has been described a construction where a judgment is made by comparing the whole of the k-bit proper word by one operation. In this embodiment, however, there will be described a construction where proper bit generating circuits are arranged in a matrix manner and the comparison of the proper word is performed in units of column.

Figure 10:
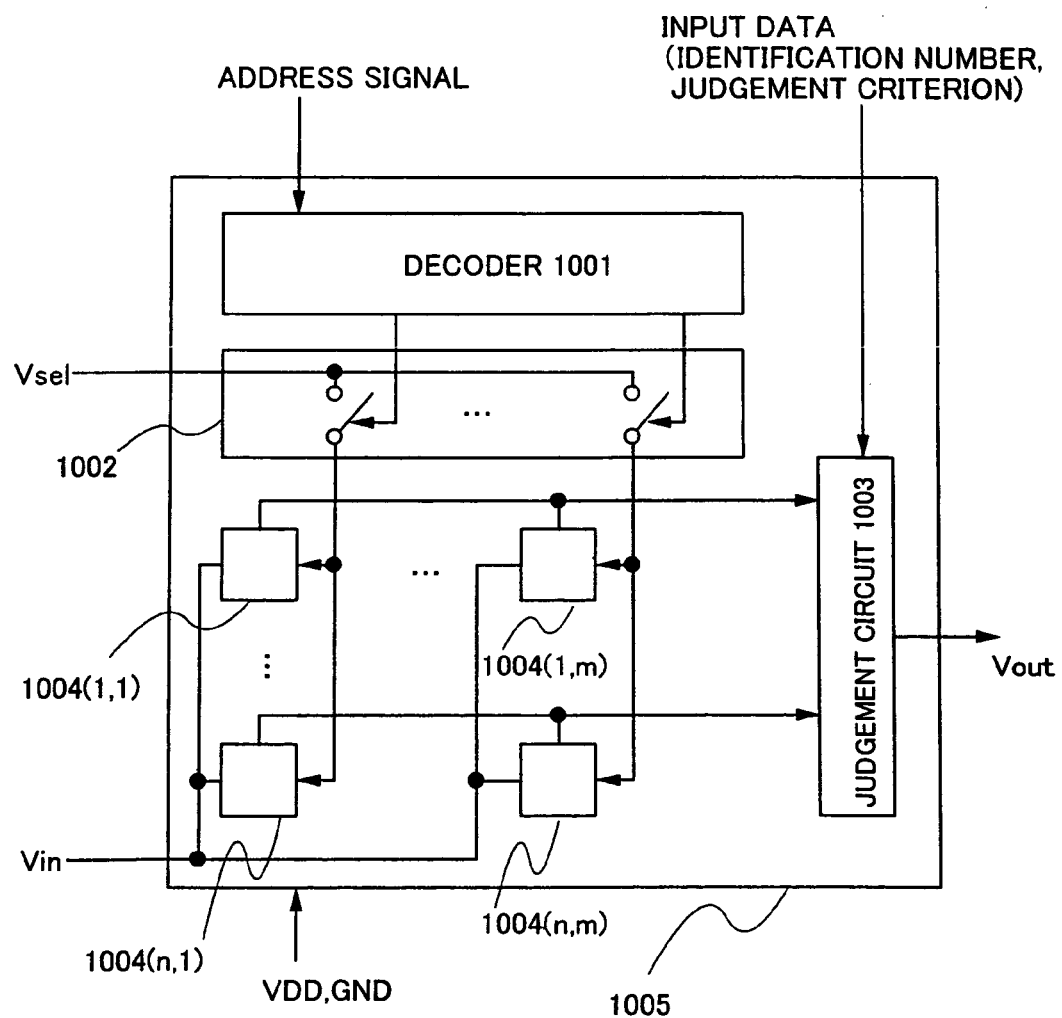
FIG. 10 is another block diagram of the substrate identification circuit of the present invention.

In FIG. 10, a substrate identification circuit is constructed from proper bit generating circuits 1004(*i, j*) (1≤i≤n, 1≤j≤m, with each of i and j being an integer) that are arranged in a matrix manner with n rows and m columns, a judgment circuit 1003, a selector 112, and a decoder 1001.

Each proper bit generating circuit 1004 receives input of a potential Vin for adjustment and an outside input Vsel, and outputs a proper bit. The proper bit generating circuit is constructed so that a proper bit is outputted if Vsel is inputted and no proper bit is outputted if Vsel is not inputted. The judgment circuit receives input of an n-bit proper word and input data (signal that determines an identification number and a judgment criterion), and outputs a judgment result Vout. Also, the decoder receives input of an address signal.

It should be noted here that it is possible to apply the circuits described in the embodiment mode and the first to fourth embodiments as the proper bit generating circuits and the judgment circuit.

When an address signal is inputted into the decoder 1001, one of m outputs is selected and a selection signal Vsel for activating the proper bit generating circuits is inputted into the proper bit generating circuits on one column. As a result of this operation, proper bits are outputted from the selected proper bit generating circuits and an n-bit proper word is inputted into the judgment circuit 1003.

In this case, the judgment circuit performs a judgment concerning whether the proper word matches the identification number by dividing the judgment into m operations. By storing all results of the m judgment operations for each bit, it is possible to perform any kind of judgment. Also, in the case where there is applied the judgment circuit described in the third embodiment, it is sufficient that there are stored only judgment results of the m judgment operations.

It should be noted here that it is possible to freely combine this embodiment with the first to fourth embodiments.

Sixth Embodiment

In this embodiment, there will be described an example where the substrate identification circuit of the present invention is formed on a TFT substrate that constitutes an active matrix type liquid crystal display portion. The following description will be made with reference to FIGS. 11A and 11B.

Figure 11A:
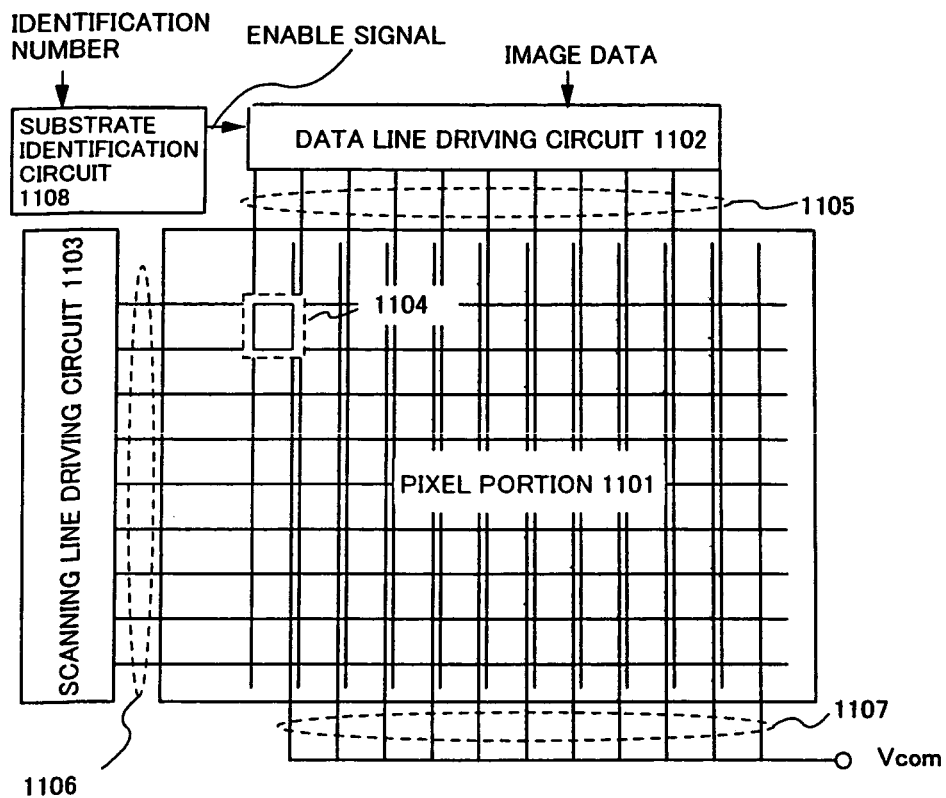
FIGS. 11A and 11B are block diagrams of an active matrix type liquid crystal display portion constituting the semiconductor device of the present invention.

FIG. 11A is a block diagram of the active matrix type liquid crystal display portion. In FIG. 11A, a TFT substrate is provided with a pixel portion 1101 in which pixels 1104 are arranged in a matrix manner, a data line driving circuit 1102, a scanning line driving circuit 1103, and a substrate identification circuit 1108.

The substrate identification circuit 1108 receives input of an identification number and outputs an enable signal as a judgment result. The data line driving circuit 1102 receives input of image data and the enable signal, and data lines 1105 are connected to this data line driving circuit 1102. Also, connected to the scanning line driving circuit 1103 are scanning lines 1106. To capacitor lines 1107, there is given a common potential Vcom.

Figure 11B:
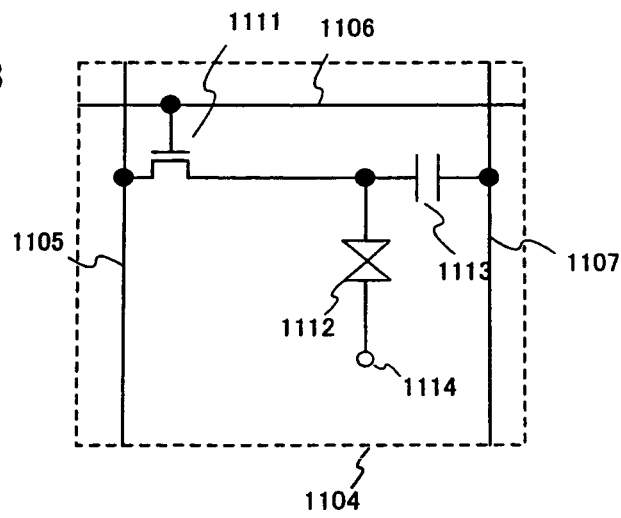

FIG. 11B shows an example of a circuit diagram of the pixel 1104 constituting the pixel portion 1101. The pixel 1104 includes a switching TFT 1111, a liquid crystal element 1112, and a capacitor 1113, with the gate electrode of the switching TFT 1111 being connected to the scanning line 1106 and one of the source and drain electrodes thereof is connected to the data line 1105. The other of the source and drain electrodes of the switching TFT 1111 is connected to the liquid crystal element 1112 and the capacitor 1113. Also, the remaining one of the electrodes of the liquid crystal element 1112 is connected to an opposing electrode 1114 and the remaining one of the electrodes of the capacitor 1113 is connected to the capacitor line 1107.

By forming the substrate identification circuit 1108 on the TFT substrate that constitutes the active matrix type liquid crystal display portion in this manner, it becomes possible to electrically process a proper word generated within the substrate identification circuit 1108 as an identification number.

For instance, in FIG. 11A, there is shown a construction where the output from the substrate identification circuit 1108 is inputted into the data line driving circuit 1102 as an enable signal and the data line driving circuit 1102 performs its operation only in the case where the enable signal is active, thereby making it possible to have this active matrix type liquid crystal display portion selectively perform its operation with reference to the identification number of the substrate.

Aside from this, there may be used a construction where the output from the substrate identification circuit 1108 is inputted into the scanning line driving circuit 1103 or a construction where there is performed outputting to the outside of the substrate.

It should be noted here that at least one of the data line driving circuit 1102 and the scanning line driving circuit 1103 may be formed on a substrate that forms the pixel portion 1101 or may be formed on a substrate that is different from the substrate that forms the pixel portion 1101.

It is possible to combine this embodiment with any of the constructions described in the first to fifth embodiments.

Seventh Embodiment

In this embodiment, there will be described an example where the substrate identification circuit of the present invention is formed on a TFT substrate that constitutes an active matrix type EL display portion. The following description will be made with reference to FIGS. 12A and 12B.

Figure 12A:
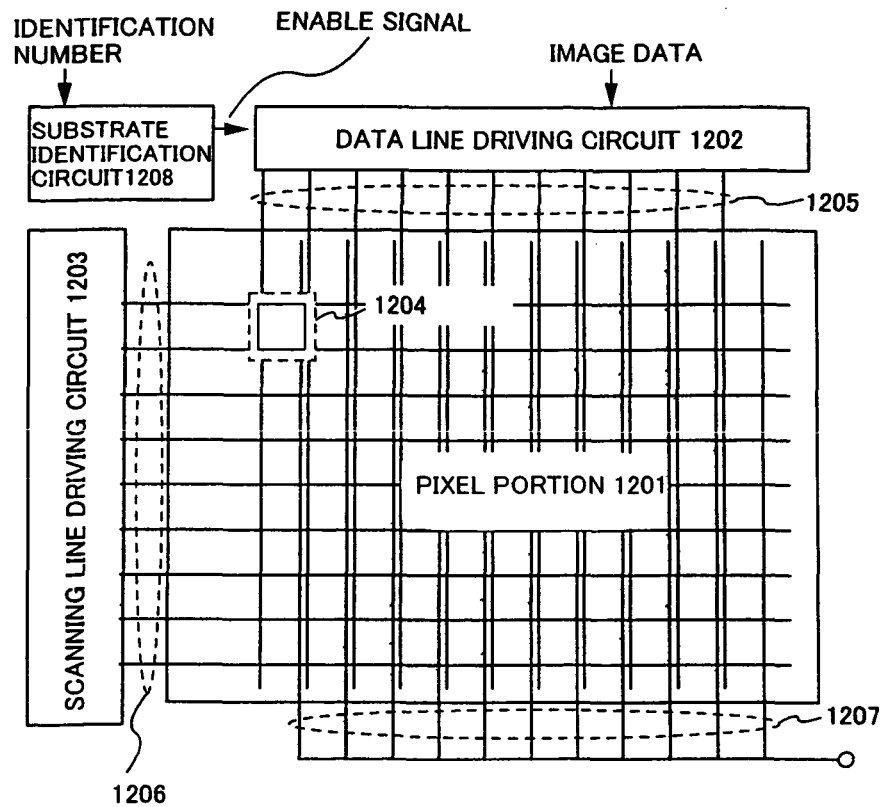
FIGS. 12A and 12B are block diagrams of an active matrix type light emitting display portion constituting the semiconductor device of the present invention.

FIG. 12A is a block diagram of the active matrix type EL display portion. In FIG. 12A, the TFT substrate is provided with a pixel portion 1201 in which pixels 1204 are arranged in a matrix manner, a data line driving circuit 1202, a scanning line driving circuit 1203, and a substrate identification circuit 1208.

The substrate identification circuit 1208 receives input of an identification number and outputs an enable signal as a judgment result. The data line driving circuit 1202 receives input of image data and the enable signal and data lines 1205 are connected to this data line driving circuit 1202. Also, connected to the scanning line driving circuit 1203 are scanning lines 1206. A power source supplying line 1207 is given a predetermined potential.

Figure 12B:
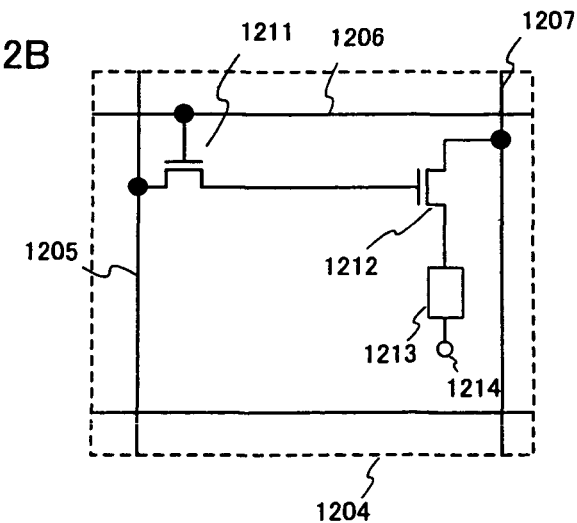

FIG. 12B shows an example of a circuit diagram of the pixel 1204 constituting the pixel portion 1201. The pixel 1204 includes a switching TFT 1211, an EL driving TFT 1212, and an EL element 1213, with the gate electrode of the switching TFT 1211 being connected to the scanning line 1206 and one of the source and drain electrodes thereof is connected to the data line 1205. The other of the source and drain electrodes of the switching TFT 1211 is connected to the gate electrode of the EL driving TFT 1212. Also, the source electrode of the EL driving TFT 1212 is connected to the power source supplying line 1207 and the drain electrode thereof is connected to the EL device 1213. The remaining one of the electrodes of the EL element 1213 is connected to an opposing electrode 1214.

By forming the substrate identification circuit 1208 on the TFT substrate that constitutes the active matrix type EL display portion in this manner, it becomes possible to electrically process a proper word generated within the substrate identification circuit 1208 as an identification number.

For instance, in FIG. 12A, there is shown a construction where the output from the substrate identification circuit 1208 is inputted into the data line driving circuit 1202 as an enable signal and the data line driving circuit 1202 performs its operation only in the case where the enable signal is active, thereby making it possible to have this active matrix type EL display portion selectively perform its operation with reference to the identification number of the substrate.

Aside from this, there may be used a construction where the output from the substrate identification circuit 1208 is inputted into the scanning line driving circuit 1203 or a construction where there is performed outputting to the outside of the substrate.

It should be noted here that at least one of the data line driving circuit 1202 and the scanning line driving circuit 1203 may be formed on a substrate that forms the pixel portion 1201 or may be formed on a substrate that is different from the substrate that forms the pixel portion 1201.

It is possible to combine this embodiment with any of the constructions described in the first to fifth embodiments.

Eighth Embodiment

In this embodiment, there will be described an example where the substrate identification circuit of the present invention is implemented on a TFT substrate on which there have been formed various logic circuits. The following description will be made with reference to FIG. 13.

Figure 13:
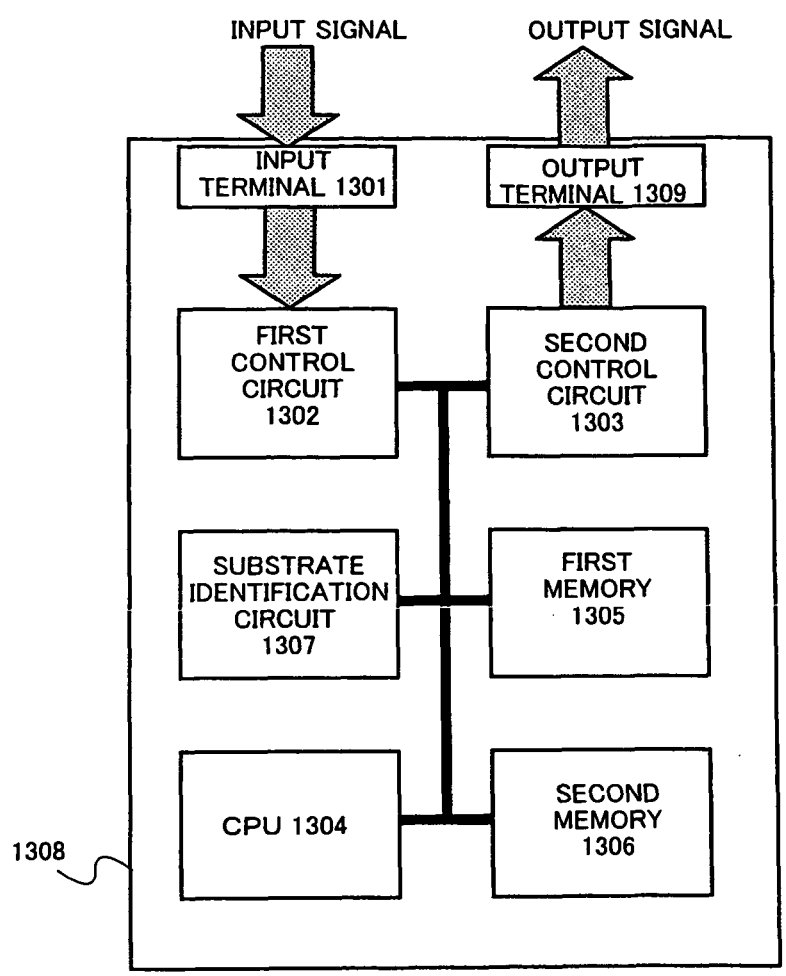
FIG. 13 is a block diagram of the semiconductor device of the present invention.

FIG. 13 is a block diagram of a TFT substrate of this embodiment and it is possible to construct an apparatus that, for instance, captures or creates the base of image data, performs processing and format conversion of the image data, and outputs image data therewith. By combining this apparatus with a liquid crystal display portion or a light emitting display portion, it becomes possible to construct a game machine, a video camera, a car navigation equipment, a personal computer, or the like, for instance.

In particular, it is also possible to apply the TFT substrate of this embodiment as an opposing substrate of the liquid crystal display portion or the light emitting display portion. In such a case, it is required that each block is formed in a portion in which the block does not influence displaying (such as a portion opposing a driving circuit portion). In the case where light is allowed to pass through only on a substrate side that forms a pixel portion, however, blocks may be formed on the entire surface of the opposing substrate.

A TFT substrate 1308 shown in FIG. 13 is provided with a first control circuit 1302, a second control circuit 1303, a CPU 1304, a first memory 1305, a second memory 1306, and a substrate identification circuit 1307. These logic circuits are constructed from TFTs and are integrally formed through a TFT production process.

Hereinafter, there will be described how the TFT substrate of this embodiment operates.

The substrate identification circuit 1307 is controlled by the CPU 1304 through a bus and performs substrate identification as required. That is, the substrate identification circuit 1307 receives input of an identification number and the CPU examines a judgment result from the substrate identification circuit 1307, thereby determining whether the TFT substrate should be allowed to perform its circuit operation.

Alternatively, there may be obtained a construction where the substrate identification circuit is specially used to output an enable signal to the first control circuit on the input side.

In FIG. 13, from an input terminal 1301, data that is the base of image data is inputted in accordance with respective electronic equipments. For instance, input data from an antenna is inputted in the case of a broadcast receiver, while input data from a CCD is inputted in the case of a video camera. Also, the data may be input data from a DV tape or a memory card. The data inputted from the input terminal 1301 is converted into an image signal by the first control circuit 1302. In the first control circuit 1302, there is performed image signal processing such as the decode processing of image data, which has been compressed and coded in accordance with an MPEG standard, a tape format, or the like, and image signal processing such as the interpolation of an image or resizing. An image signal outputted from the first control circuit 1302 or an image signal created or processed by the CPU 1304 is inputted into the second control circuit 1303, which then converts the image signal into a format (a scanning format or the like, for instance) that is suited for a semiconductor display portion 302. From the second control circuit 1303, there are outputted an image signal obtained as a result of the format conversion and a control signal.

The CPU 1304 controls signal processing in the first control circuit 1302, the second control circuit 1303, and other interface circuits with efficiency. The CPU 1304 also creates and processes image data. The first memory 1305 is used as a memory area for storing image data outputted from the first control circuit 1302 or image data outputted from the second control circuit 1303, a work memory area used by the CPU to perform control, a work memory area used by the CPU to create image data, and the like. As the first memory 1305, there is used a DRAM or an SRAM. The second memory 1306 is a memory area for storing color data or character data that is necessary in the case where image data is created or processed by the CPU 1314, and is constructed from a mask ROM or an EPROM.

It is possible to combine this embodiment with any of the constructions described in the first to fifth embodiments.

Ninth Embodiment

In this embodiment, there will be described an example where the substrate identification circuit of the present invention is implemented on a TFT substrate on which there have been integrally formed a pixel portion, a driving circuit for the pixel portion, and other logic circuits. The following description will be made with reference to FIG. 14.

Figure 14:
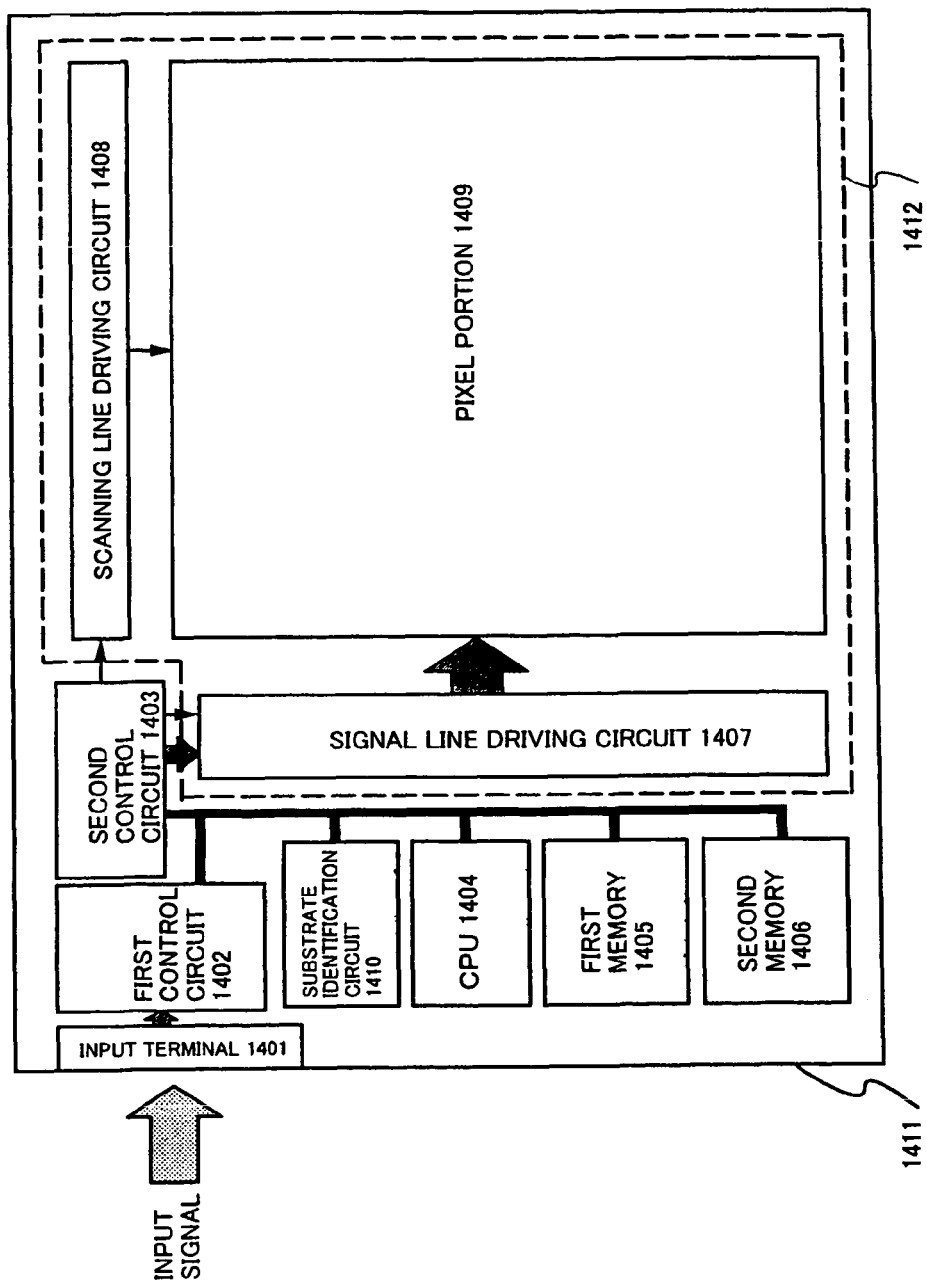
FIG. 14 is another block diagram of the semiconductor device of the present invention.

FIG. 14 is a block diagram of a TFT substrate of this embodiment and it is possible to construct an apparatus that, for instance, captures or creates the base of image data, performs processing and format conversion of the image data, and displays an image therewith. It is possible to construct a game machine, a video camera, a car navigation equipment, a personal computer, or the like, for instance.

A TFT substrate 1411 shown in FIG. 14 is provided with a first control circuit 1402, a second control circuit 1403, a CPU 1404, a first memory 1405, a second memory 1406, a substrate identification circuit 1410, and a semiconductor display portion 1412. The semiconductor display portion 1412 is constructed from a scanning line driving circuit 1408, a signal line driving circuit 1407, and a pixel portion 1409.

The substrate identification circuit 1410 is controlled by the CPU 1404 through a bus and performs substrate identification as required. That is, the substrate identification circuit 1410 receives input of an identification number and the CPU examines a judgment result from the substrate identification circuit 1410, thereby determining whether the TFT substrate should be allowed to perform its circuit operation.

Alternatively, there may be obtained a construction where the substrate identification circuit is specially used to output an enable signal to the first control circuit on the input side.

The block construction shown in FIG. 14 has a construction where the block diagram shown in FIG. 13 is combined with a semiconductor display portion and it is possible to know the operation and function thereof by referring to the eighth embodiment.

It is possible to combine this embodiment with any of the constructions described in the first to fifth embodiments.

Tenth Embodiment

In this embodiment, there will be described a method of producing a TFT substrate that constitutes an active matrix type liquid crystal display portion in which there is implemented the substrate identification circuit of the present invention. In the following description, a writing TFT and a retaining capacitor will be explained as representatives of a pixel portion and an N-channel type TFT and a P-channel type TFT will be explained as representatives of the driving circuit for the pixel portion, the substrate identification circuit, and other logic circuits (such as a CPU and an SRAM). Note that in this embodiment, the driving circuit for the pixel portion, the substrate identification circuit, and other logic circuits are collectively referred to as the "logic circuit portion". With the production method in this embodiment, it becomes possible to integrally form the pixel portion, the driving circuit for the pixel portion, the substrate identification circuit, and other logic circuits on a substrate having an insulating surface.

As a substrate 3001, there is used a substrate obtained by forming an insulating film on the surface of a glass substrate, a quartz substrate, a silicon substrate, a metallic substrate, or a stainless substrate. Also, it is possible to use a plastic substrate if it has an enough heat resistance against the processing temperature during this production process. In this embodiment, a substrate made of glass, such as barium borosilicate glass or aluminoborosilicate glass, is used as the substrate 3001.

Next, a base film 3002 made of insulating films, each of which is a silicon oxide film, a silicon nitride film, a silicon nitride oxide film, or the like, is formed on the substrate 3001 with a publicly known means. The base film 3002 in this embodiment is formed using a double-layered structure, although it is possible to use a single-layered structure of the insulating film or a structure where at least two insulating films described above are laminated on each other.

In this embodiment, as the first layer of the base film 3002, a silicon nitride oxide film 3002a is formed to have a thickness of 10 to 200 nm (preferably, 50 to 100 nm) using $SiH_4$, $NH_3$, and $N_2O$ as a reaction gas with a plasma CVD method. In this embodiment, the silicon nitride oxide film 3002a is formed to have a thickness of 50 nm. Next, as the second layer of the base film 3002, a silicon nitride oxide film 3002b is formed to have a thickness of 50 to 200 nm (preferably, 100 to 150 nm) using $SiH_4$ and $N_2O$ as a reaction gas with a plasma CVD method. In this embodiment, the silicon nitride oxide film 3002b is formed to have a thickness of 100 nm.

Next, a semiconductor film is formed on the base film. This semiconductor film is obtained by forming a semiconductor film having a thickness of 25 to 200 nm (preferably, 30 to 150 nm) with a publicly known method (such as a sputtering method, an LPCVD method, or a plasma CVD method) and crystallizing the semiconductor film using a laser crystallization method or a publicly known thermal crystallization method.

In order to produce a crystalline semiconductor film with the laser crystallization method, there is used a solid-state laser, gas laser, or metallic laser of continuous oscillation or pulse oscillation. Note that as the solid-state laser, it is possible to use a YAG laser, a $YVO_4$ laser, a YLF laser, a $YAlO_3$ laser, a glass laser, a ruby laser, an alexandrite laser, a Ti:sapphire laser, or the like of continuous oscillation or pulse oscillation. Also, as the gas laser, it is possible to use an excimer laser, an Ar laser, a Kr laser, a $CO_2$ laser, or the like of continuous oscillation or pulse oscillation. Further, as the metallic laser, it is possible to use a helium cadmium laser, a copper vapor laser, or a gold vapor laser. Needless to say, this embodiment is not limited to the laser crystallization method, and it is possible to perform the crystallization by combining this method with another publicly known crystallization method (RTA, a thermal crystallization method using a furnace annealing furnace, a thermal crystallization method using a metallic element that promotes crystallization, or the like). As the semiconductor film, it is possible to use an amorphous semiconductor film, a microcrystal semiconductor film, a crystalline semiconductor film, or the like and it is also possible to apply a compound semiconductor film, such as an amorphous silicon germanium film, that has an amorphous structure.

In this embodiment, an amorphous silicon film having a thickness of 50 nm is formed with a plasma CVD method and this amorphous silicon film is processed with a laser crystallization method and a thermal crystallization method that uses a metallic element that promotes crystallization. After nickel used as the metallic element is introduced onto the amorphous silicon film with a solution application method, a heat treatment is performed at 550° C. for five hours, thereby obtaining a first crystalline silicon film. Then, laser light emitted from a $YVO_4$ laser of continuous oscillation, whose output power is 10 W, is converted into the second harmonic with a nonlinear optical element. Following this, a linear beam is formed with any of the optical systems described in the third to sixth embodiments and is irradiated, thereby obtaining a second crystalline silicon film. The first crystalline silicon film is converted into the second crystalline silicon film through the irradiation of laser light, thereby improving the crystallinity. It is required that this operation is performed at an energy density of around 0.01 to 100 $MW/cm^2$ (preferably, 0.1 to 10 $MW/cm^2$), and irradiation is performed by relatively moving a stage with reference to the laser light at a speed of around 0.5 to 2000 cm/s. In this manner, there is formed the crystalline silicon film. Also, in the case where there is used an excimer laser of pulse oscillation, it is preferable that the frequency is set at 300 Hz and the laser energy density is set at 100 to 1000 $mJ/cm^2$ (representatively, at 200 to 800 $mJ/cm^2$). During this operation, laser lights may be set so as to overlap each other at a ratio of 50 to 98%.

Needless to say, it is also possible to produce TFTs using the first crystalline silicon film, although it is preferable that the second crystalline silicon film is used because the crystallinity of the second crystalline silicon film is improved, which in turn will improve the electric characteristics of the TFTs.

The crystalline semiconductor film obtained in this manner is subjected to patterning processing using a photolithography method, thereby forming island-like semiconductor layers 3003 to 3006.

It should be noted here that after the semiconductor layers 3003 to 3006 are formed, these semiconductor layers may be doped with a very small quantity of impurity element (boron or phosphorus) in order to control the threshold values of the TFTs.

Next, there is formed a gate insulating film 3007 that covers the island-like semiconductor layers 3003 to 3006. As the gate insulating film 3007, there is formed an insulating film that contains silicon and has a thickness of 40 to 150 nm using a plasma CVD method or a sputtering method. In this embodiment, there is formed a silicon oxynitride film having a thickness of 120 nm. Needless to say, the gate insulating film is not limited to this silicon oxynitride film and there may be used another insulating film containing silicon that has a single-layered structure or a multi-layered structure.

Then, a first conductive film 3008 and a second conductive film 3009 for forming gate electrodes are formed on the gate insulating film 3007. In this embodiment, the first conductive film 3008 is formed using Ta to have a thickness of 50 to 100 nm and the second conductive film 3009 is formed using W to have a thickness of 100 to 300 nm.

A Ta film is formed by sputtering Ta (sputtering target) with Ar using a sputtering method.

Also, a W film is formed with a sputtering method whose target is W. Aside from this, this W film may be formed with a thermal CVD method that uses tungsten hexafluoride ($WF_6$).

It should be noted here that the first conductive film 3008 is made of Ta and the second conductive film 3009 is made of W in this embodiment, although these conductive films are not specially limited and each of them may be formed using an element selected from the group consisting of Ta, W, Ti, Mo, Al, Cu, and the like. Alternatively, each conductive film may be formed using an alloy material or a compound material whose main ingredient is the element described above. Also, there may be used a semiconductor film typified by a polycrystalline silicon film doped with an impurity element such as phosphorus.

It should be noted here that in the case where there occurs no problem even if the size of each LDD is reduced, there may be used a single-layered structure of W or the like. Also, it is possible to reduce the length of the LDD by setting a taper angle close to a right angle even if the same structure is used.

Next, masks 3010 to 3015 made of a resist are formed and first etching processing is performed to form electrodes and wirings. In this embodiment, there is performed etching based on ICP (Inductively Coupled Plasma). In the case where an etching gas is a mixture of $CF_4$ and $Cl_2$, the W film and the Ta film are etched by the same degree.

Under the etching conditions described above, edge portions of the first conductive layer and the second conductive layer are processed to have a tapered shape due to the shapes of the masks made of a resist and the effect of a bias voltage applied on the substrate side. The angle of the tapered portions is set in a range of 15 to 45°. By doing so, conductive layers 3017 to 3022 having a first shape composed of the first conductive layer and the second conductive layer (first conductive layers 3017a to 3022a and second conductive layers 3017b to 3022b) are formed through the first etching processing. During this processing, each area of the gate insulating film 3007 that is not covered with the conductive layers 3017 to 3022 having the first shape is etched by around 20 to 50 nm, so that there are formed areas 3016 whose thicknesses are reduced (FIG. 15B).

Following this, as shown in FIG. 15C, second etching processing is performed under a state where the resist masks 3010 and 3015 are not removed. The W film is selectively etched using $CF_4$, $Cl_2$, and $O_2$ as an etching gas. During this processing, conductive layers 3024 to 3029 having a second shape (first conductive layers 3024a to 3029a and second conductive layers 3024b to 3029b) are formed through the second etching processing. During this processing, each area of the gate insulating film 3007 that is not covered with the conductive layers 3024 to 3029 having the second shape is further etched by around 20 to 50 nm, so that there are formed areas 3023 whose thicknesses are reduced.

Then, first doping processing is performed, thereby adding an impurity element that gives the n-type conductivity. It is sufficient that this doping processing is performed with an ion doping method or an ion implantation method. The condition regarding the ion doping method is that the dosage is set at $1\times10^{13}$ to $5\times10^{14}$ atoms/cm$^2$ and the acceleration voltage is set at 60 to 100 keV. An element belonging to Group 15 (typically, phosphorus (P) or arsenic (As)) is used as the impurity element that gives the n-type conductivity, and phosphorus (P) is used in this embodiment. In this case, the conductive layers 3024 to 3029 function as masks against the impurity element that gives the n-type conductivity and first impurity regions 3030 to 3033 are formed in a self-aligning manner. The impurity element that gives the n-type conductivity is added to the first impurity regions 3030 to 3033 in a concentration range of $1\times10^{20}$ to $1\times10^{21}$ atoms/cm$^3$ (FIG. 15C).

Then, second doping processing is performed under a state shown in FIG. 16A where portions that will become a p-type TFT and a writing TFT are covered with resist masks 3034 and 3035. During this processing, none of pixel portion TFTs is covered with the resist masks and doping is performed under a state where these TFTs are exposed to the outside. The second doping processing is performed by doping an impurity element that give the n-type conductivity under a condition where the dosage is reduced from that during the first doping processing and the acceleration voltage is increased from that during the first doping processing. For instance, the second doping processing is performed by setting the acceleration voltage at 70 to 120 keV and setting the dosage at $1\times10^{13}$ atoms/cm$^2$, thereby forming new impurity regions 3036 to 3038 within the first impurity regions 3030 to 3033 formed on the island-like semiconductor layers in FIG. 15B. During the doping, the conductive layers 3024 and 3028 having the second shape are used as masks against the impurity element and the doping is performed so that the impurity element is also added to the semiconductor layers existing under areas of the first conductive layers 3024a and 3028a that are not covered with the resist masks. In this manner, there are formed third impurity regions 3039 and 3040. The concentration of phosphorus (P) added to these third impurity regions 3039 and 3040 has a gentle concentration gradient along the film thickness of the tapered portions of the first conductive layers 3024a and 3028a.

Then, as shown in FIG. 16B, fourth impurity regions 3043 and 3044, whose conductive type is opposite to the first conductive type, are formed on the island-like semiconductor layer 3004 forming a p-channel type TFT and the island-like semiconductor layer 3006 forming a retaining capacitor. By using the conductive layers 3025b and 3028b having the second shape as masks against the impurity element, impurity regions are formed in a self-align manner. During this processing, the entire surfaces of the island-like semiconductor layer 3003 forming an n-channel type TFT and the pixel portion TFT 3005 are covered with the resist masks 3041 and 3042. During the doping, the conductive layers 3025 and 3028 having the second shape are used as the masks against the impurity element and the doping is performed so that the impurity element is also added to the semiconductor layers existing under areas of the first conductive layers 3025a and 3028a that are not covered with the resist masks. In this manner, there are formed fifth impurity regions 3045 and 3046. The phosphorus has been added to impurity regions 3043 and 3044 at different concentrations. However, these regions are formed with an ion doping method that uses diborane ($B_2H_6$) and the concentration of the impurity is set in a range of $2\times10^{20}$ to $2\times10^{21}$ atoms/cm$^3$ in both regions.

As a result of the processing described above, impurity regions are formed on each island-like semiconductor layer. The conductive layers 3024 to 3027 having the third shape overlapping the island-like semiconductor layers function as gate electrodes. Also, the element numbered 3029 functions as an island-like source signal line, while the element numbered 3028 functions as capacitor wiring.

After the resist masks 3041 and 3042 are removed, there is carried out a process in which the impurity elements added to the island-like semiconductor layers are activated. This process is carried out with a thermal annealing method that uses a furnace annealing furnace. Aside from this, it is possible to use a laser annealing method or a rapid thermal annealing method (RTA method). The thermal annealing method is carried out in a nitrogen atmosphere, in which oxygen concentration is at 1 ppm or less (preferably, at 0.1 ppm or less), at 400 to 700° C. (typically, at 500 to 600° C.). In this embodiment, a heat treatment is performed at 500° C. for four hours.

Further, in an atmosphere that contains hydrogen at a ratio of 3 to 100%, a heat treatment is performed at 300 to 450° C. for one to 12 hours, thereby performing a process for hydrogenating the island-like semiconductor layers. This process is a process for terminating the dangling bonds of the semiconductor layers with hydrogen that has been thermally excited. As another method of performing the hydrogenation, there may be performed plasma hydrogenation (that uses hydrogen excited by plasma).

Next, a silicon oxynitride film is formed as a first interlayer insulating film 3047 to have a thickness of 100 to 200 nm (FIG. 16C). Then, a second interlayer insulating film 3048 made of an organic insulating material, such as acrylic, is formed on the first interlayer insulating film 3047. Also, as the second interlayer insulating film 3048, it is possible to use an inorganic material in place of the organic insulating material. As the inorganic material, it is possible to use $SiO_2$ (PCVD-$SiO_2$) produced with an inorganic $SiO_2$ or a plasma CVD method, SOG (Spin on Glass; applied silicon oxide film), or the like. After two interlayer insulating films are formed, an etching process is performed to form contact holes.

Then, in the logic circuit portion, there are formed source wirings 3049 and 3050 that form source regions and contacts of the island-like semiconductor layers and drain wiring 3051 that forms drain regions and contacts thereof. Also, in the pixel portion, a connection electrode 3052 and pixel electrodes 3053 and 3054 are formed (FIG. 17A).

It should be noted here that the writing TFT has a double-gate structure in this embodiment, although this TFT may have a single-gate structure or a multi-gate structure having a plurality of gates.

In the manner described above, it is possible to form the logic circuit portion having the n-channel type TFT and p-channel type TFT as well as the pixel portion having the writing TFT and the retaining capacitor on the same substrate. A substrate, on which the TFTs have been formed in this manner, is referred to as the "TFT substrate".

In this embodiment, the edge portions of the pixel electrodes are arranged so as to overlap source signal lines and writing gate signal lines. With this construction, it becomes possible to shade spaces among the pixel electrodes without using a black matrix.

Also, according to the processing described in this embodiment, it becomes possible to set the number of photomasks that are necessary to produce the TFT substrate at five. That is, it is sufficient that there are used an island-like semiconductor layer pattern, a first wiring pattern (source signal line, capacitor wiring), a mask pattern for p-channel regions, a contact hole pattern, and a second wiring pattern (including pixel electrodes and connection electrodes). This makes it possible to shorten the process and contributes to a reduction in manufacturing cost and an improvement in yields.

Following this, after a TFT substrate under the state shown in FIG. 17A is obtained, an orientation film 3055 is formed on the TFT substrate and rubbing processing is performed.

Meanwhile, there is prepared an opposing substrate 3056. On the opposing substrate 3056, there are formed color filter layers 3057 to 3059 and an overcoat layer 3060. As to the color filter layers, a red color filter layer 3057 and a blue color filter layer 3058 are formed above the TFTs so as to overlap each other. By doing so, the color filter layers are given a construction where these color filter layers double as shading films. It is required that at least spaces among the TFTs, the connection electrode, and the pixel electrodes are shaded, so that it is preferable that the red color filter and the blue color filter are arranged so as to overlap each other and to shade these spaces.

Also, with reference to the connection electrode 3052, the red color filter layer 3057, the blue color filter layer 3058, and the green color filter layer 3059 are set so as to overlap each other and a spacer 3064 is formed. The color filter in each color is obtained by forming a film having a thickness of 1 to 3 μm using a material obtained by mixing an acrylic resin with a pigment. It is possible to form these color filters in a predetermined pattern using a photosensitive material with a mask. It is possible to set the height of the spacer 3064 at 2 to 7 μm (preferably, at 4 to 6 μm) with consideration given to the thickness of the overcoat layer 3060 that is 1 to 4 μm, and a gap is formed by this height when the active matrix substrate and the opposing substrate are bonded together. The overcoat layer 3060 is formed using an organic resin material of a light curing type or a thermal curing type and there is used polyimide, an acrylic resin, or the like, for instance.

After the overcoat layer 3060 is formed, opposing electrodes 3061 are formed through patterning. Then, after an orientation film 3062 is formed, there is performed rubbing processing.

Then, the TFT substrate, on which the pixel portion and the logic circuit portion have been formed, and the opposing substrate are bonded together using a seal agent 3065. Filler is blended into the seal agent 3065 and the two substrates are bonded together so that a uniform space is maintained therebetween by this filler and the spacer. Following this, a liquid crystal material 3063 is injected between these substrates and these substrates are completely sealed with a sealing agent (not shown). It is sufficient that a publicly known liquid crystal material is used as the liquid crystal material 3063. In this manner, there is obtained the active matrix type liquid crystal display apparatus shown in FIG. 17B.

In the manner described above, it is possible to produce an active matrix type liquid crystal display apparatus where a logic circuit portion having an n-channel type TFT and a p-channel type TFT as well as a pixel portion having a writing TFT and a retaining capacitor have been formed on the same substrate.

It should be noted here that the TFTs in the active matrix type liquid crystal display apparatus produced by the process described above adopts a top-gate structure. However, aside from this, it is possible to produce bottom-gate type TFTs that each have a structure where a gate electrode is formed under an active layer or dual-gate type TFTs that each have a structure where gate electrodes are provided above and under an active layer, with the active layer being sandwiched therebetween.

It is possible to implement this embodiment by freely combining this embodiment with the embodiment mode and the first to seventh and ninth embodiments.

Eleventh Embodiment

It is also possible to form the substrate identification circuit of the present invention on a TFT substrate that constitutes an active matrix type light emitting display portion. In this embodiment, by following the process described in the tenth embodiment, there will be described a process for forming a light emitting element from a TFT substrate, on which first and second interlayer insulating films have been formed as shown in FIG. 12A, and a cross-sectional structure of a substrate, on which the light emitting element has been formed.

Figure 18A:
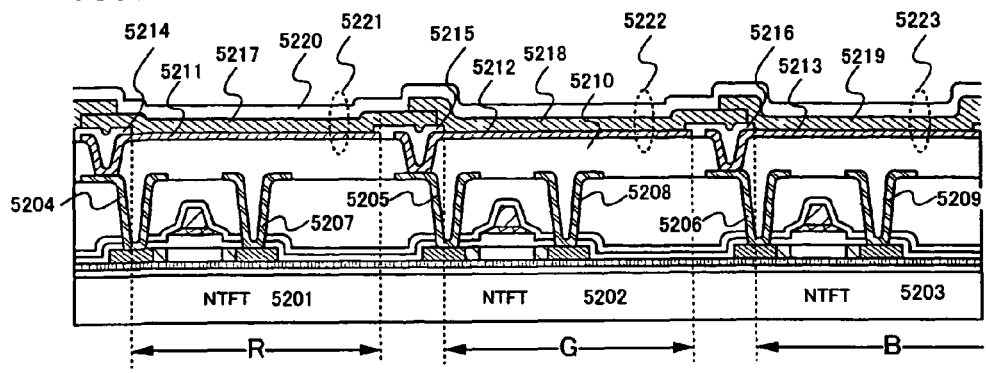
FIGS. 18A to 18C are cross-sectional views of the active matrix type light emitting display portion.
Figure 18B:
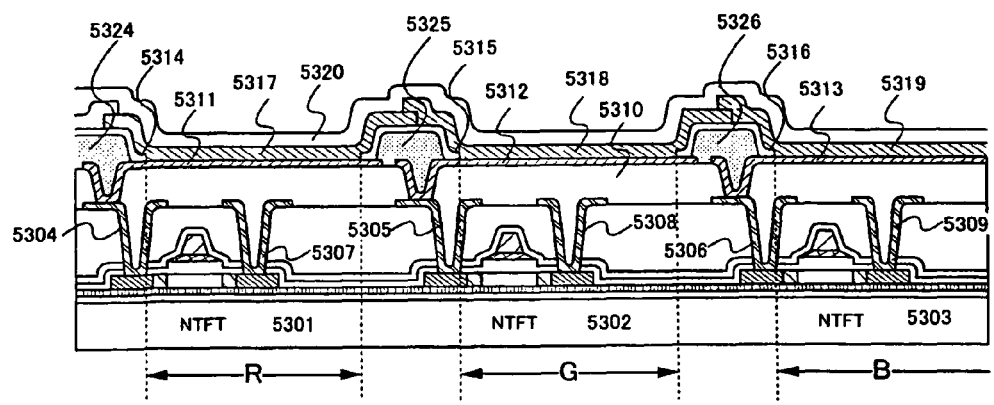
Figure 18C:
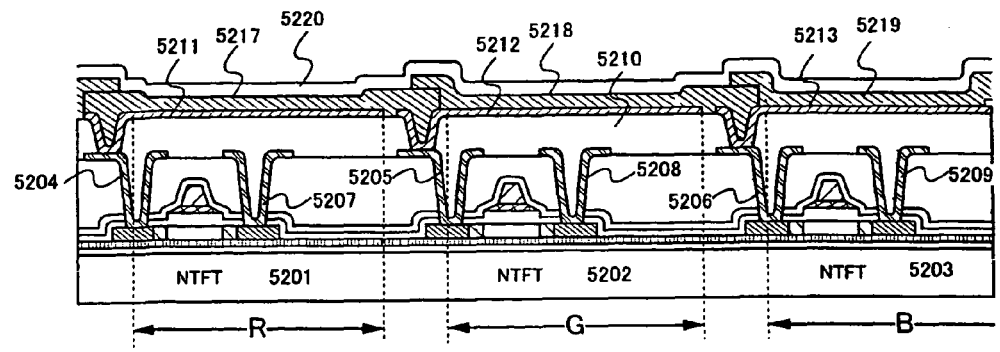

FIGS. 18A and 18B each show a cross-sectional structure of a substrate that constitutes an active matrix type light emitting portion in which light emitting layers corresponding to a plurality of colors have been produced. In this embodiment, in particular, the cross-sectional structure of a pixel having three sub-pixels corresponding to respective colors of R (red), G (green), and B (blue) will be described with reference to FIGS. 18A and 18B.

In FIG. 18A, reference numerals 5201 to 5203 denote N-channel type TFTs that drive light emitting elements corresponding to respective colors of R (red), G (green), and B (blue).

First, in accordance with the process described in the tenth embodiment, the first and second interlayer insulating films are formed as shown in FIG. 12A.

Reference numerals 5204 to 5206 denote drain wirings that are electrically connected to the drain regions of the N-channel type TFTs 5201 to 5203. Reference numerals 5207 to 5209 represent source wirings that are electrically connected to the source regions of the N-channel type TFTs 5201 to 5203.

In this embodiment, the drain wirings 5204 to 5206 and the source wirings 5207 to 5209 are formed by continuously forming a lamination film including a Ti film having a film thickness of 100 nm, an Al film having a film thickness of 350 nm, and a Ti film having a film thickness of 100 nm with a sputtering method and patterning the film into a desired shape. Note that the drain wirings 5204 to 5206 and the source wirings 5207 to 5209 are not limited to the construction described above and there may be used a single-layered structure, a double-layered structure, or a multi-layered structure having four or more layers. In addition, the material of the wirings is not limited to the combination of Al and Ti and these wirings may be formed using another material.

Then, a third interlayer insulating film 5210 is formed so as to cover the drain wirings 5204 to 5206 and the source wirings 5207 to 5209. As to the third interlayer insulating film 5210, a silicon nitride oxide film, a silicon oxynitride film, a silicon nitride film, a silicon oxide film, or the like is formed to have a thickness of 10 to 300 nm (preferably, 50 to 200 nm) using a plasma CVD method. In this embodiment, as the third interlayer insulating film 5210, a silicon nitride oxide film is formed to have a thickness of 150 nm.

Next, contact holes reaching the drain wirings 5204 to 5206 are formed in the third interlayer insulating film 5210 and cathodes 5211 to 5213 are formed on the contact holes. The cathodes 5211 to 5213 are formed by forming an alloy film of magnesium and silver (Mg—Ag film) having a thickness of 30 to 300 nm and patterning the film into a desired shape. As to the material of the cathodes 5211 to 5213, it is possible to use a conductive film made of an element belonging to Group 1 or Group 2 of the periodic table or a conductive film to which there has been added an element constructed from them.

Then, fourth interlayer insulating films are formed so as to cover the entire surfaces of the cathodes 5211 to 5213. In this embodiment, a silicon nitride film having a thickness of 100 nm is formed so as to cover the cathodes 5211 to 5213 and then is patterned into a desired shape, thereby forming fourth interlayer insulating films 5214 to 5216. The fourth interlayer insulating films 5214 to 5216 may be suitably formed by forming a silicon nitride oxide film, a silicon oxynitride film, a silicon nitride film, a silicon oxide film, or the like having a thickness of 10 to 300 nm (preferably, 50 to 200 nm) and patterning the film into a desired shape.

Next, light emitting layers 5217 to 5219 are formed in areas (opening portions) of the cathodes 5211 to 5213 in which the fourth interlayer insulating films 5214 to 5216 are not formed and which are exposed. The light emitting layers 5217 to 5219 are formed using materials corresponding to respective colors of R (red), G (green), and B (blue).

When doing so, the light emitting layers 5217 to 5219 are constructed using different materials, so that it is difficult to form these layers by one operation. Therefore, in this embodiment, by using a metal mask, the light emitting layer 5217 for R is first formed, the light emitting layer 5218 for G is next formed, and the light emitting layer 5219 for B is lastly formed. As to the materials constituting the light emitting layers 5217 to 5219, it is sufficient that these layers are formed using publicly known materials. Also, as to the structure of the light emitting layers 5217 to 5219, it is sufficient that there is used a publicly known structure and it does not matter whether a single-layered structure or a multi-layered structure is adopted.

Then, finally, an anode 5220 is formed so that the light emitting layers 5217 to 5219 are covered with this anode 5220. In this embodiment, the anode 5220 is formed by forming a compound (ITO) film of indium oxide and tin oxide having a thickness of 110 nm. The anode 5220 is formed using a transparent conductive film and it is also possible to use a material obtained by adding gallium to this transparent conductive film.

When the anode 5220 is formed, light emitting elements are finished. These light emitting elements equate to diodes formed by the cathodes 5211 to 5213, the light emitting layers 5217 to 5219, and the anode 5220. In FIG. 18A, a portion, in which the cathode 5211, the light emitting layer 5217, and the anode 5220 overlap each other, corresponds to a light emitting element 5221 for R. Also, a portion, in which the cathode 5212, the light emitting layer 5218, and the anode 5220 overlap each other, corresponds to a light emitting element 5222 for G, and a portion, in which the cathode 5213, the light emitting layer 5219, and the anode 5220 overlap each other, corresponds to a light emitting element 5223 for B. Also, light emitted from the light emitting elements 5221 to 5223 travels toward the anode 5220.

When light emitting layers corresponding to respective colors of RGB are applied separately from each other with a conventional technique, there are formed banks corresponding to respective colors, in many cases. However, in the case of the cross-sectional structure shown in FIG. 18A, no bank has been formed. In addition, in place of the banks, there are formed the fourth interlayer insulating films 5214 to 5216. In this embodiment, by adopting this structure, it becomes possible to enlarge the opening portions of pixels. In other words, it becomes possible to improve the aperture ratio of the pixels.

It should be noted here that on areas in which the fourth interlayer insulating films 5214 to 5216 are formed, there are formed the light emitting layers corresponding to different colors. For instance, on the interlayer insulating film 5214, there are formed the light emitting layer 5217 for R and the light emitting layer 5219 for B. That is, the interlayer insulating film 5214 is formed on the cathode 5211 and the light emitting layers 5217 and 5219 corresponding to two colors are formed on the interlayer insulating film 5214. Also, the anode 5220 is formed on the light emitting layers 5217 and 5219. That is, no diode is formed in areas in which the fourth interlayer insulating films 5214 to 5216 are formed, so that light is not emitted from the light emitting layers 5214 to 5216.

Next, a cross-sectional structure of a pixel having a construction that is different from that shown in FIG. 18A will be described with reference to FIG. 18B. Note that materials and the like constituting pixels are the same as those described with reference to FIG. 18A, so that only the construction will be described below.

In FIG. 18B, reference numerals 5301 to 5303 denote N-channel type TFTs that drive light emitting elements corresponding to respective colors of R (red), G (green), and B (blue).

Reference numerals 5304 to 5306 denote drain wirings that are electrically connected to the drain regions of the N-channel type TFTs 5301 to 5303. Reference numerals 5307 to 5309 represent source wirings that are electrically connected to the source regions of the N-channel type TFTs 5301 to 5303.

Then, a third interlayer insulating film 5310 is formed so that the drain wirings 5304 to 5306 and the source wirings 5307 to 5309 are covered with the third interlayer insulating film 5310. In this embodiment, as the third interlayer insulating film 5310, a silicon nitride oxide film is formed to have a thickness of 150 nm.

Next, contact holes reaching the drain wirings 5304 to 5306 are formed in the third interlayer insulating film 5310 and cathodes 5311 to 5313 are formed on the contact holes.

Then, interlayer insulating films 5324 to 5326 are formed so that the cathodes 5311 to 5313 are completely covered with these interlayer insulating films. The interlayer insulating films 5324 to 5326 function as banks. Therefore, when opening portions are formed, if the side walls of the opening portions do not draw sufficiently gentle slopes, a degradation in light emitting layers resulting from steps causes a prominent problem, so that the opening portions need to be formed with care.

Next, fourth interlayer insulating films 5314 to 5316 are formed on banks 5324 to 5326. Then, light emitting layers 5317 to 5319 are formed on the cathodes 5311 to 5313 in areas (opening portions) in which the fourth interlayer insulating films 5314 to 5316 are not formed and which are exposed. The light emitting layers 5317 to 5319 are formed using materials corresponding to respective colors of R (red), G (green), and B (blue).

When doing so, the light emitting layers 5317 to 5319 are formed using different materials, so that it is difficult to form these layers by one operation. Therefore, in this embodiment, by using a metal mask, the light emitting layer 5317 for R is first formed, the light emitting layer 5318 for G is next formed, and the light emitting layer 5319 for B is lastly formed.

Then, finally, an anode 5320 is formed so that the light emitting layers 5317 to 5319 are covered with this anode 5320. In this embodiment, as the anode 5320, a compound (ITO) film of indium oxide and tin oxide is formed to have a thickness of 110 nm.

When the anode 5320 is formed, light emitting elements are finished. These light emitting elements equate to diodes formed by the cathodes 5311 to 5313, the light emitting layers 5317 to 5319, and the anode 5320. In FIG. 18B, a portion, in which the cathode 5311, the light emitting layer 5317, and the anode 5320 overlap each other, corresponds to a light emitting element 5321 for R. Also, a portion, in which the cathode 5312, the light emitting layer 5318, and the anode 5320 overlap each other, corresponds to a light emitting element 5322 for G, and a portion, in which the cathode 5313, the light emitting layer 5319, and the anode 5320 overlap each other, corresponds to a light emitting element 5323 for B.

In the cross-sectional structure shown in FIG. 18B, there are formed the banks 5324 to 5326 corresponding to respective colors so that light emitting layers corresponding to respective colors of RGB are applied separately from each other. That is, no diode is formed in areas in which the banks 5324 to 5326 are formed, so that light is not emitted from the light emitting layers 5314 to 5316.

It is possible to implement this embodiment by freely combining this embodiment with the embodiment mode and the first to seventh and ninth embodiments.

Twelfth Embodiment

The substrate identification circuit of the present invention can be built in a substrate for application where display portions are constructed in a variety of electronic equipment. Examples of such electronic equipment may include, portable information terminals (electronic notebooks, mobile computers and mobile telephones etc), video cameras, digital cameras, personal computers and televisions. Examples of which are shown in FIG. 19.

Figure 19A:
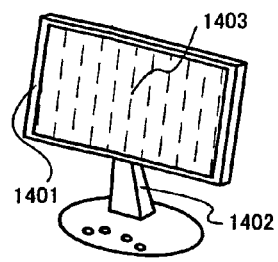
FIGS. 19A to 19G show examples of electronic equipments to which the present invention is applied.

FIG. 19A is a liquid crystal display or an EL display, which is constituted by a case 1401, a supporting base 1402, a display portion 1403 and the like. The substrate identification circuit of the present invention can be built for application in the substrate constituted for the display portion 1403.

Figure 19B:
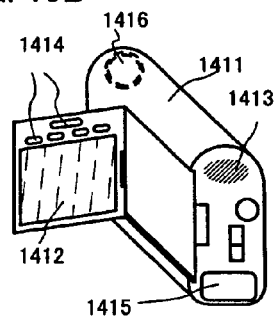

FIG. 19B is a video camera, which is constituted by a main body 1411, a display portion 1412, a voice input portion 1413, an operation switch 1414, a battery 1415, an image receiving portion 1416 and the like. The substrate identification circuit of the present invention can be built for application in the substrate constituted for the display portion 1412.

Figure 19C:
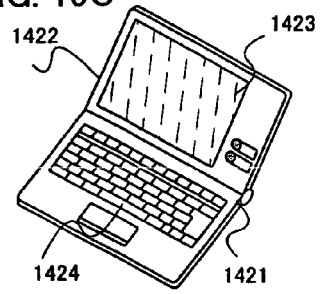

FIG. 19C is a notebook personal computer, which is constituted by a main body 1421, a frame 1422, a display portion 1423, a keyboard 1424 and the like. The substrate identification circuit of the present invention can be built for application in the substrate constituted for the display portion 1423.

Figure 19D:
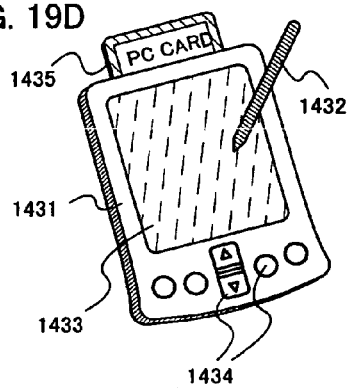

FIG. 19D is a portable information terminal, which is constituted by a main body 1431, a stylus 1432, a display portion 1433, an operation button 1434, an external interface 1435 and the like. The substrate identification circuit of the present invention can be built for application in the substrate constituted for the display portion 1433.

Figure 19E:
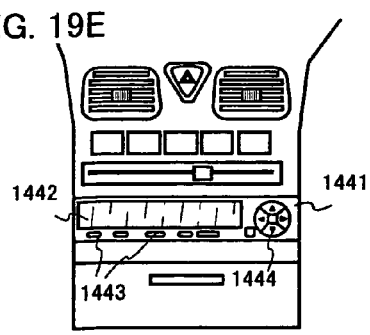

FIG. 19E is a sound reproducing system, specifically an on-vehicle audio apparatus, which is constituted by a main body 1441, a display portion 1442, an operation switch 1443 and 1444, and the like. The substrate identification circuit of the present invention can be built for application in the substrate constituted for the display portion 1442. Additionally, although the on-vehicle audio apparatus is illustrated in this example, the invention can also be used for a portable or household audio apparatus.

Figure 19G:
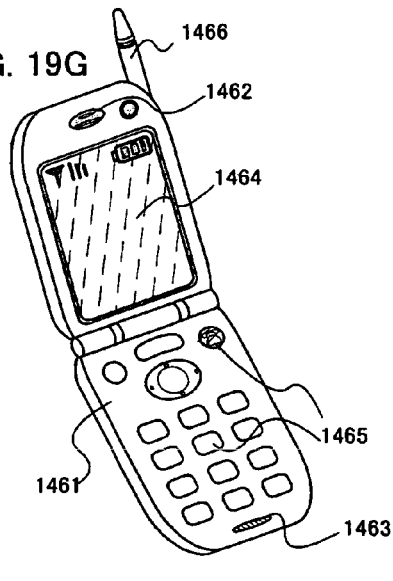
Figure 19F:
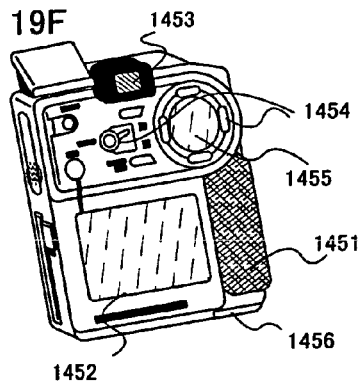

FIG. 19F is a digital camera, which is constituted by a main body 1451, a display portion (A) 1452, an eyepiece portion 1453, an operation switch 1454, a display portion (B) 1455, a battery 1456 and the like. The substrate identification circuit of the present invention can be built for application in the substrate constituted for the display portion (A) 1452 and the display portion (B) 1455.

FIG. 19G is a mobile telephone, which is constituted by a main body 1461, an audio output portion 1462, an audio input portion 1463, a display portion 1464, an operation switch 1465, an antenna 1466 and the like. The substrate identification circuit of the present invention can be built for application in the substrate constituted for the display portion 1464.

By implementing the substrate identification circuit of the present invention on a substrate constituting a display portion applied to an electronic equipment in this manner, it becomes possible to assign a number for identifying the electronic equipment (or the substrate constituting the equipment) at low cost, in safety, and in an electrical manner. As a result, it becomes possible to apply the identification number to a purpose of selectively giving various rights as well as managing the electronic equipment (or the substrate constituting the equipment).

Note that a display apparatus applied to the electronic equipment may be constructed using a heat-resistant plastic substrate as well as a glass substrate. With this construction, it becomes possible to achieve further weight reduction.

Also, the example described in this embodiment is just an example and there is no intention to limit this embodiment to the purposes described above.

It is possible to implement this embodiment by freely combining this embodiment with the embodiment mode and the first to eleventh embodiments.

With the substrate identification circuit of the present invention, it becomes possible to assign a proper numerical value to a TFT substrate at low cost, with the numerical value being a substrate identification number whose rewriting and duplication are difficult and which is capable of being handled as an electric signal.

With the present invention, it becomes possible to provide a TFT substrate or a semiconductor device having such a substrate identification circuit.

As a result, it becomes possible to, at low cost and in safety, manage a TFT substrate or a semiconductor device, in which the TFT substrate has been implemented, and selectively give a guarantee or a right to receive service.

What is claimed is:

1. A substrate identification circuit comprising:
   an input line;
   proper bit generating circuits formed on a substrate to be identified, each of the proper bit generating circuits comprising transistors forming a differential amplification circuit and being connected to the input line,
   wherein in each of the proper bit generating circuits the differential amplification circuit is configured to output to a respective one of output lines a one-bit number based on variations in threshold values among the transistors, the differential amplification circuit comprising two input terminals and one output terminal, and
   wherein the proper bit generating circuits are configured to output a numeric value proper to the substrate by outputting the one-bit numbers in parallel to the output lines.

2. A semiconductor device having the substrate identification circuit according to claim 1, wherein the substrate identification circuit and a pixel portion are integrally formed on the substrate.

3. A semiconductor device having the substrate identification circuit according to claim 1, wherein the substrate identification circuit, a pixel portion, and a driving circuit for driving the pixel portion are integrally formed on the substrate.

4. A semiconductor device having the substrate identification circuit according to claim 1, wherein the substrate identification circuit and an operation processing circuit are integrally formed on the substrate.

5. A semiconductor device having the substrate identification circuit according to claim 1, wherein the substrate identification circuit and a memory are integrally formed on the substrate.

6. A semiconductor device having the substrate identification circuit according to claim 1, wherein the semiconductor device is a liquid crystal display device.

7. A semiconductor device having the substrate identification circuit according to claim 1, wherein the semiconductor device is a light emitting device.

8. A semiconductor device having the substrate identification circuit according to claim 1, wherein the semiconductor device is selected from the group consisting of a game machine, a video camera, a head mount type display, a DVD player, a personal computer, a mobile telephone, and a car audio equipment.

9. The substrate identification circuit according to claim 1,
   wherein k proper bit generating circuits are formed on the substrate, k being a natural number, and
   wherein the numeric value is a k-bit numeric value.

10. A substrate identification circuit comprising:
    an input line;
    proper bit generating circuits formed on a substrate to be identified, each of the proper bit generating circuits comprising transistors forming an inverter and being connected to the input line,
    wherein in each of the proper bit generating circuits the inverter is configured to output to a respective one of output lines a one-bit number based on variations in threshold values among the transistors, and
    wherein the proper bit generating circuits are configured to output a numeric value proper to the substrate by outputting the one-bit numbers in parallel to the output lines.

11. A semiconductor device having the substrate identification circuit according to claim 10, wherein the substrate identification circuit and a pixel portion are integrally formed on the substrate.

12. A semiconductor device having the substrate identification circuit according to claim 10, wherein the substrate identification circuit and an operation processing circuit are integrally formed on the substrate.

13. A semiconductor device having the substrate identification circuit according to claim 10, wherein the substrate identification circuit and a memory are integrally formed on the substrate.

14. The substrate identification circuit according to claim 10,
    wherein k proper bit generating circuits are formed on the substrate, k being a natural number, and
    wherein the numeric value is a k-bit numeric value.

15. A substrate identification circuit comprising:
    an input line;
    proper bit generating circuits formed on a substrate to be identified, each of the proper bit generating circuits comprising transistors forming an amplifier and being connected to the input line,
    wherein in each of the proper bit generating circuits the amplifier is configured to output to a respective one of output lines a one-bit number based on variations in threshold values among the transistors, and
    wherein the proper bit generating circuits are configured to output a numeric value proper to the substrate by outputting the one-bit numbers in parallel to the output lines.

16. A semiconductor device having the substrate identification circuit according to claim 15, wherein the substrate identification circuit and a pixel portion are integrally formed on the substrate.

17. A semiconductor device having the substrate identification circuit according to claim 15, wherein the substrate identification circuit and an operation processing circuit are integrally formed on the substrate.

18. A semiconductor device having the substrate identification circuit according to claim 15, wherein the substrate identification circuit and a memory are integrally formed on the substrate.

19. The substrate identification circuit according to claim 15,
   wherein k proper bit generating circuits are formed on the substrate, k being a natural number, and
   wherein the numeric value is a k-bit numeric value.

* * * * *